(12) United States Patent
Kim

(10) Patent No.: US 12,438,133 B2
(45) Date of Patent: Oct. 7, 2025

(54) SEMICONDUCTOR PACKAGE

(71) Applicant: Samsung Electronics Co., Ltd., Suwon-si (KR)

(72) Inventor: Joonsung Kim, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 529 days.

(21) Appl. No.: 17/722,616

(22) Filed: Apr. 18, 2022

(65) Prior Publication Data
US 2023/0054984 A1     Feb. 23, 2023

(30) Foreign Application Priority Data

Aug. 18, 2021 (KR) .................. 10-2021-0108659

(51) Int. Cl.
*H01L 25/10* (2006.01)
*H01L 23/00* (2006.01)
(Continued)

(52) U.S. Cl.
CPC ...... *H01L 25/105* (2013.01); *H01L 23/49816* (2013.01); *H01L 23/49822* (2013.01);
(Continued)

(58) Field of Classification Search
CPC ............... H01L 25/105; H01L 23/5389; H01L 2224/32145; H01L 2224/16237; H01L 25/0657; H01L 25/10–13; H01L 2225/10–1094; H01L 25/043; H01L 25/074; H01L 25/0756; H01L 25/117;
(Continued)

(56) References Cited

U.S. PATENT DOCUMENTS 8,237,252 B2   8/2012  Pagaila et al.
8,754,514 B2 * 6/2014  Yu ...................... H01L 25/0657
                                                         257/687
(Continued)

FOREIGN PATENT DOCUMENTS

CN       108109974 A     6/2018
CN       110534435 A    12/2019
(Continued)

*Primary Examiner* — Julio J Maldonado
*Assistant Examiner* — Paul A Berry
(74) *Attorney, Agent, or Firm* — Harness, Dickey & Pierce, P.L.C.

(57) ABSTRACT

A semiconductor package includes a connection substrate on a package substrate and has an opening that penetrates therethrough. A chip stack is on the package substrate and in the opening. A redistribution layer is on the connection substrate and the chip stack. An upper semiconductor chip is on first redistribution pads of the redistribution layer. External terminals are on a bottom surface of the package substrate. The chip stack includes a first semiconductor chip on substrate pads of the package substrate, and a second semiconductor chip on the first semiconductor chip and second redistribution pads of the redistribution layer. The redistribution layer includes a first region that overlaps the upper semiconductor chip and a second region beside the upper semiconductor chip. The first redistribution pads are on the first region. The second redistribution pads are on the second region.

15 Claims, 20 Drawing Sheets

(51) Int. Cl.
*H01L 23/498* (2006.01)
*H01L 23/538* (2006.01)

(52) U.S. Cl.
CPC .. *H01L 23/49833* (2013.01); *H01L 23/49838* (2013.01); *H01L 23/5385* (2013.01); *H01L 23/5386* (2013.01); *H01L 23/5389* (2013.01); *H01L 24/16* (2013.01); *H01L 24/32* (2013.01); *H01L 2224/16227* (2013.01); *H01L 2224/16237* (2013.01); *H01L 2224/32145* (2013.01); *H01L 2225/1023* (2013.01); *H01L 2225/1035* (2013.01); *H01L 2225/1041* (2013.01); *H01L 2225/1058* (2013.01); *H01L 2924/1431* (2013.01); *H01L 2924/1438* (2013.01)

(58) Field of Classification Search
CPC ... H01L 2225/1035; H01L 2225/06503; H01L 2225/06568
See application file for complete search history.

(56) References Cited

U.S. PATENT DOCUMENTS

| | | | |
|---|---|---|---|
| 9,496,249 B2 | 11/2016 | Chen et al. | |
| 9,601,463 B2 | 3/2017 | Yu et al. | |
| 9,859,255 B1 | 1/2018 | Yoon et al. | |
| 10,050,016 B2 | 8/2018 | Lee et al. | |
| 10,547,119 B2 | 1/2020 | Kim et al. | |
| 10,784,248 B2 | 9/2020 | Yu et al. | |
| 10,854,551 B2 | 12/2020 | Yu et al. | |
| 2009/0127686 A1 | 5/2009 | Yang et al. | |
| 2013/0037950 A1* | 2/2013 | Yu | H01L 23/5226 257/E23.021 |
| 2013/0168871 A1* | 7/2013 | Kim | H01L 25/105 257/774 |
| 2015/0333040 A1 | 11/2015 | Jeong | |
| 2017/0084589 A1 | 3/2017 | Kuo et al. | |
| 2018/0138127 A1 | 5/2018 | Lee et al. | |
| 2020/0402941 A1 | 12/2020 | Olson et al. | |
| 2021/0265274 A1* | 8/2021 | Joo | H01L 23/5389 |

FOREIGN PATENT DOCUMENTS

| | | |
|---|---|---|
| KR | 101190920 B1 | 10/2012 |
| KR | 10-2019-0062387 A | 6/2019 |
| KR | 10-2020-0137220 A | 12/2020 |

\* cited by examiner

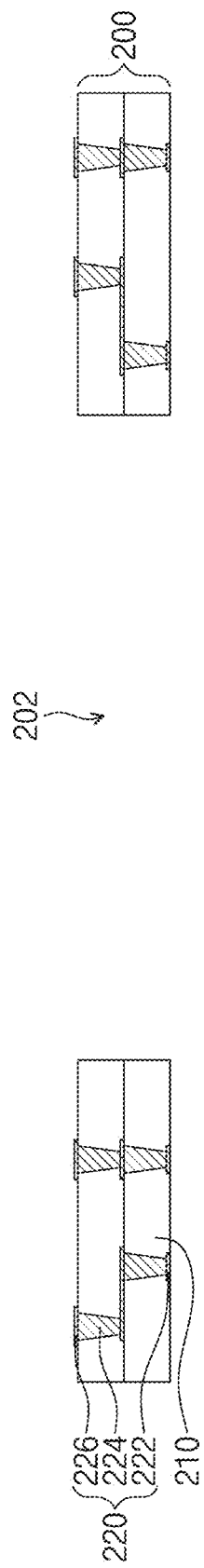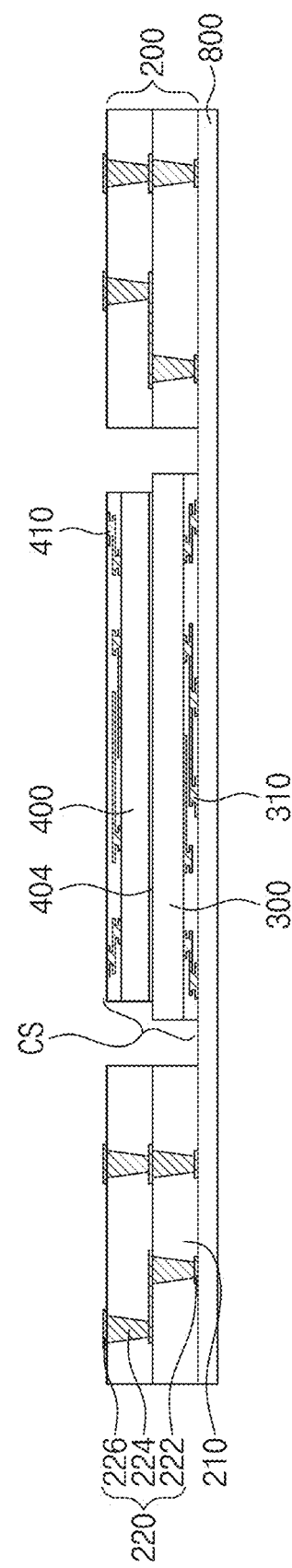

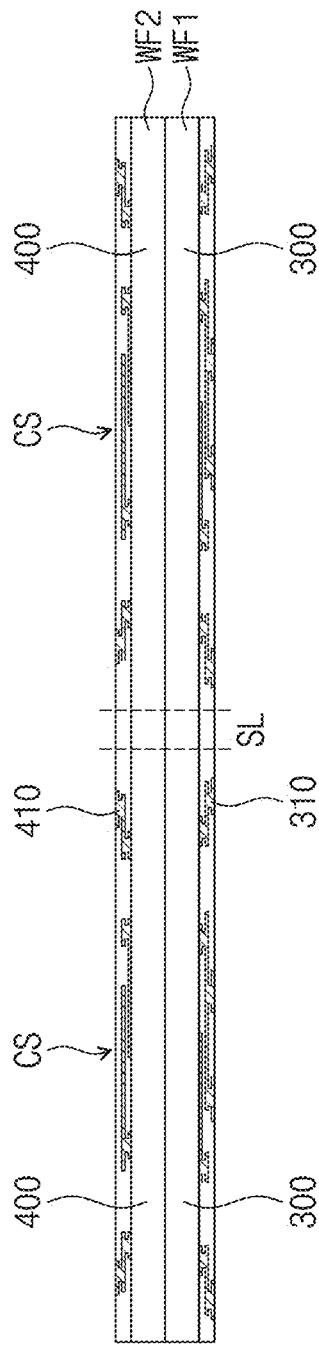
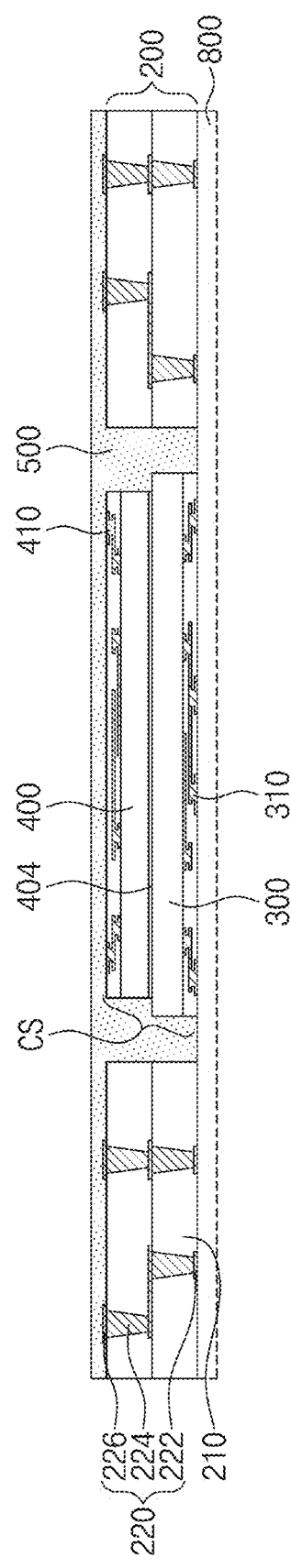

SEMICONDUCTOR PACKAGE

CROSS-REFERENCE TO RELATED APPLICATION

This U.S. nonprovisional application claims priority under 35 U.S.C § 119 to Korean Patent Application No. 10-2021-0108659 filed on Aug. 18, 2021 in the Korean Intellectual Property Office, the disclosure of which is hereby incorporated by reference in its entirety.

BACKGROUND

The present inventive concepts relate to a semiconductor package and/or a method of fabricating the same.

With the development of the electronics industry, electronic products have increasing demands for high performance, high speed, and compact size. To meet the trend, there has recently been developed a packaging technology in which a plurality of semiconductor chips are mounted in a single package.

A semiconductor package is provided to implement an integrated circuit chip to qualify for use in electronic products. Typically, in the semiconductor package, a semiconductor chip is mounted on a printed circuit board (PCB) and bonding wires or bumps are used to electrically connect the semiconductor chip to the printed circuit board. With the recent development of the electronics industry, the semiconductor package is variously developed to reach the goal of compact size, small weight, and/or low manufacturing cost. In addition, many kinds of semiconductor packages show up with the expansion of their application field such as high-capacity mass storage devices.

SUMMARY

Some embodiments of inventive concepts provide a compact-sized semiconductor package.

Some embodiments of the present inventive concepts provide a semiconductor package with increased electrical properties.

According to some embodiments of the present inventive concepts, a semiconductor package may comprise: a package substrate; a connection substrate on the package substrate and having an opening that penetrates the connection substrate; a chip stack on the package substrate and in the opening; a redistribution layer on the connection substrate and the chip stack; an upper semiconductor chip on first redistribution pads of the redistribution layer; and a plurality of external terminals on a bottom surface of the package substrate. The chip stack may include a first semiconductor chip on substrate pads of the package substrate, and a second semiconductor chip on the first semiconductor chip and on second redistribution pads of the redistribution layer. The redistribution layer may include a first region that overlaps the upper semiconductor chip, and a second region beside the upper semiconductor chip. The first redistribution pads may be on the first region. The second redistribution pads may be on the second region.

According to some embodiments of the present inventive concepts, a semiconductor package may comprise: a package substrate; a redistribution layer on the package substrate; a connection substrate that connects the package substrate to the redistribution layer, the connection substrate having an opening that vertically penetrates the connection substrate; a first semiconductor chip in the opening, a first active surface of the first semiconductor chip in contact with the package substrate; a second semiconductor chip in the opening, a second active surface of the second semiconductor chip in contact with the redistribution layer; and a third semiconductor chip on the redistribution layer. The redistribution layer may include a dielectric pattern, a first redistribution pad and a second redistribution pad that are on a top surface of the dielectric pattern, a first redistribution via that vertically penetrates the dielectric pattern to connect the first redistribution pad to a chip pad of the second semiconductor chip, and a protection layer on the top surface of the dielectric pattern, the protection layer covers the first redistribution pad and the second redistribution pad. The third semiconductor chip may be directly connected through a chip terminal to the second redistribution pad exposed on the protection layer. The first redistribution pad and the second redistribution pad may be at the same level from the package substrate.

According to some embodiments of the present inventive concepts, a semiconductor package may comprise: a package substrate; a first semiconductor chip on the package substrate; a redistribution layer on the first semiconductor chip; a second semiconductor chip on a first surface of the redistribution layer; a third semiconductor chip on a second surface of the redistribution layer; and a connection member between the package substrate and the redistribution layer and beside of the first semiconductor chip, the connection member connects the package substrate to the redistribution layer. The redistribution layer may include a first redistribution pad and a second redistribution pad that are at the same level from the package substrate. The second semiconductor chip may be directly mounted through a first terminal on the first redistribution pad. The third semiconductor chip may be directly mounted through a second terminal on the second redistribution pad. The redistribution layer may include a first region on which the first redistribution pad is provided and a second region on which the second redistribution pad is provided. The second region may vertically overlap both of the second semiconductor chip and the third semiconductor chip. The first region may be horizontally spaced apart from the third semiconductor chip.

BRIEF DESCRIPTION OF THE DRAWINGS

The drawings described herein are for illustrative purposes only of selected embodiment and not all possible implementation, and are not intended to limit the scope of the present disclosure.

FIGS. 16 to 22 illustrate cross-sectional views showing a method of fabricating a semiconductor package according to some embodiments of the present inventive concepts.

DETAILED DESCRIPTION OF EMBODIMENTS

The following will now describe a semiconductor package according to the present inventive concepts with reference to the accompanying drawings.

Figure 1:
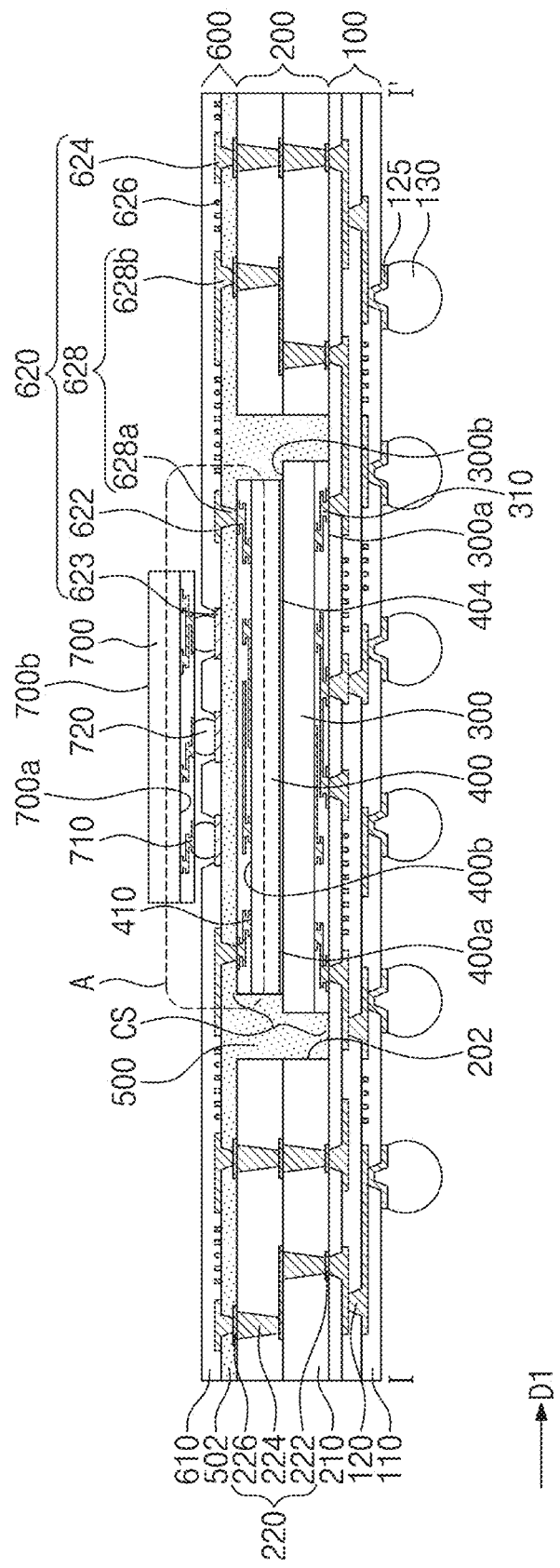
FIGS. 1 to 3 illustrate cross-sectional views showing a semiconductor package according to some embodiments of the present inventive concepts.
Figure 2:
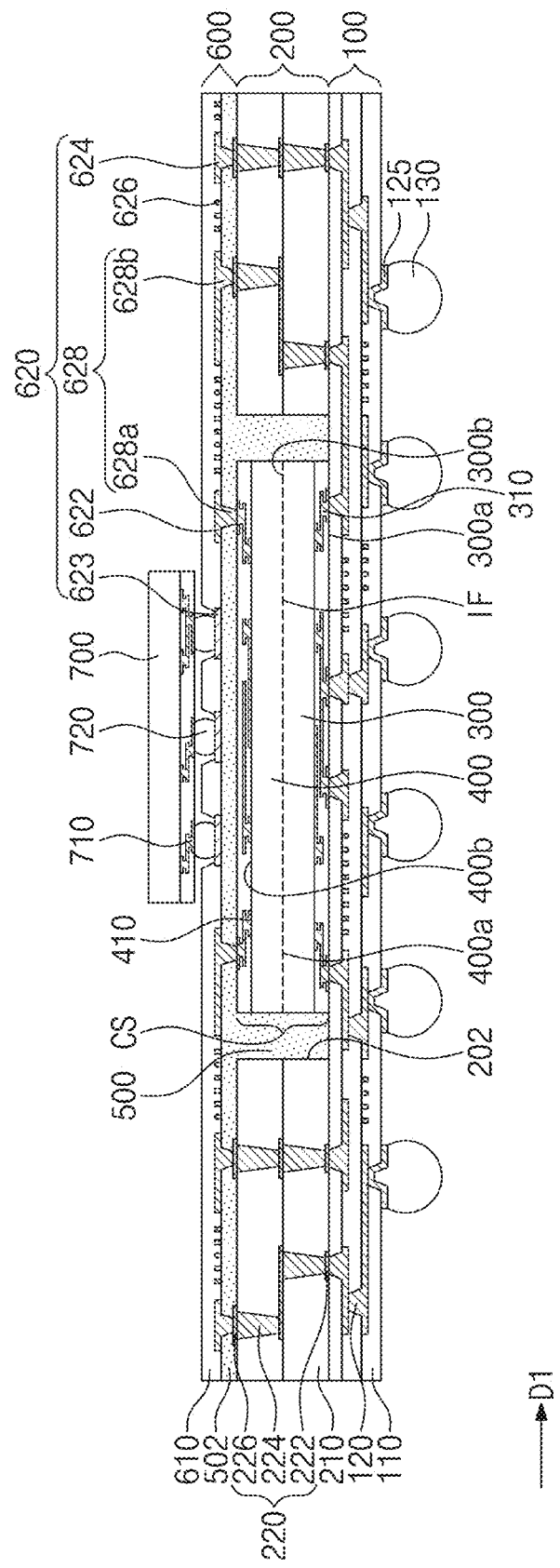
Figure 3:
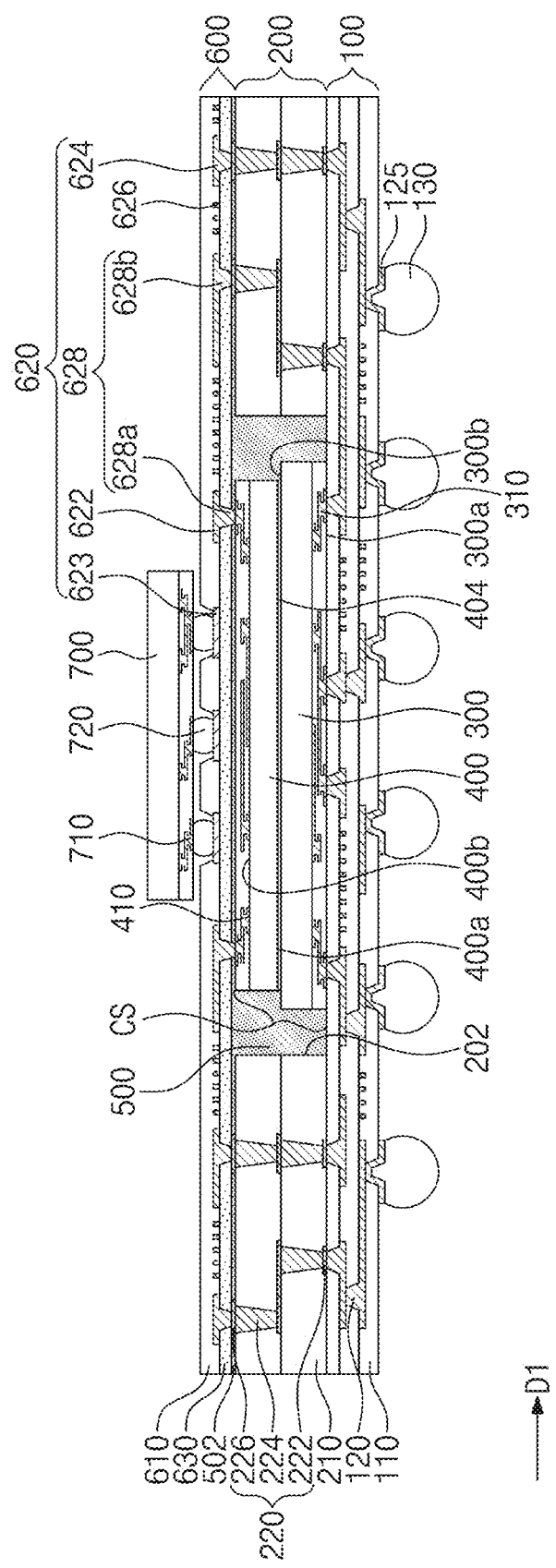
Figure 4:
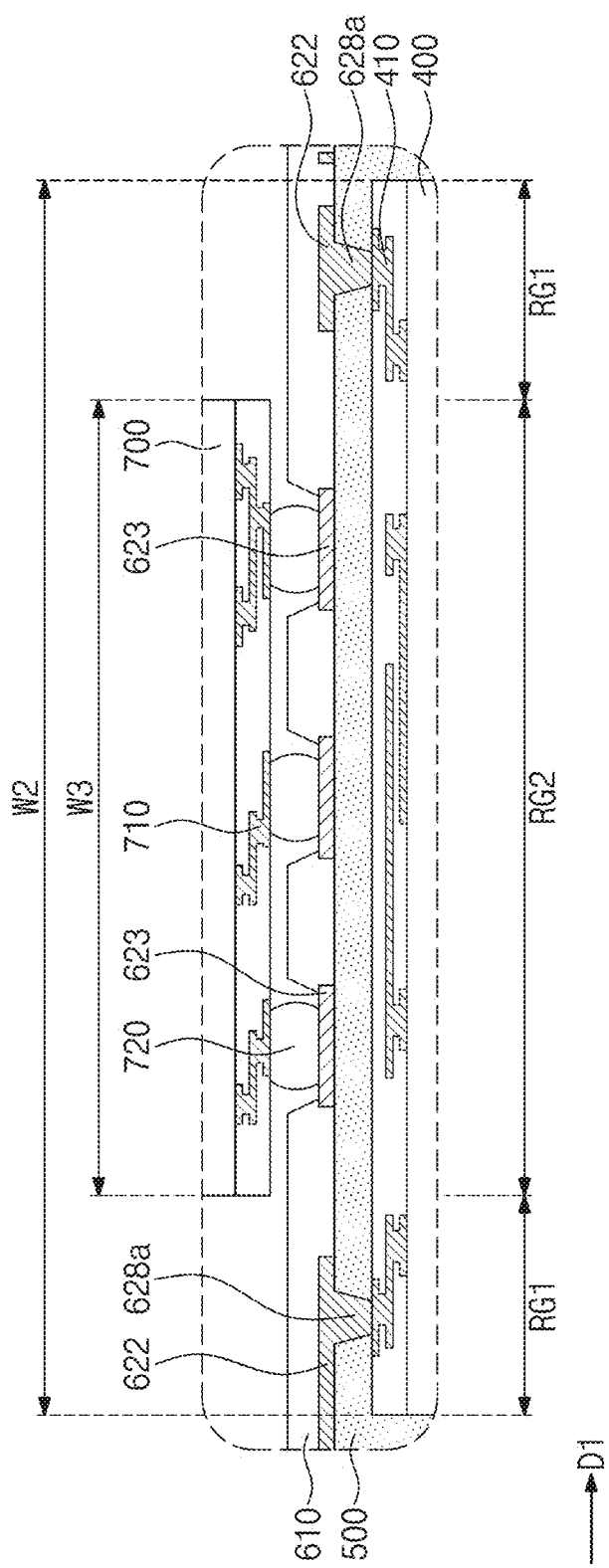
FIG. 4 illustrates an enlarged cross-sectional view showing a semiconductor package according to some embodiments of the present inventive concepts.
Figure 5:
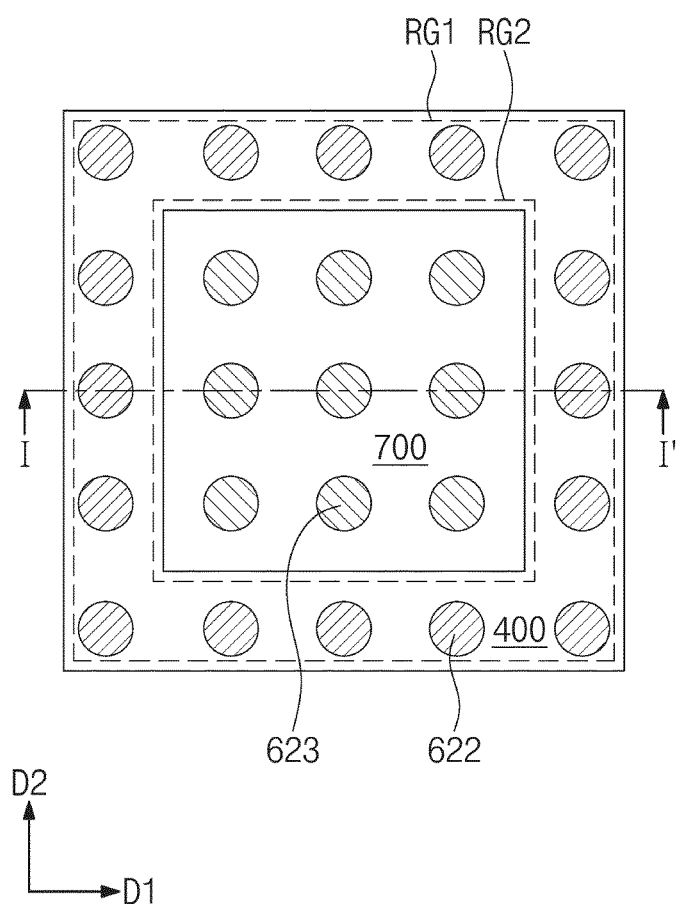
FIGS. 5 and 6 illustrate plan views showing a semiconductor package according to some embodiments of the present inventive concepts.
Figure 6:
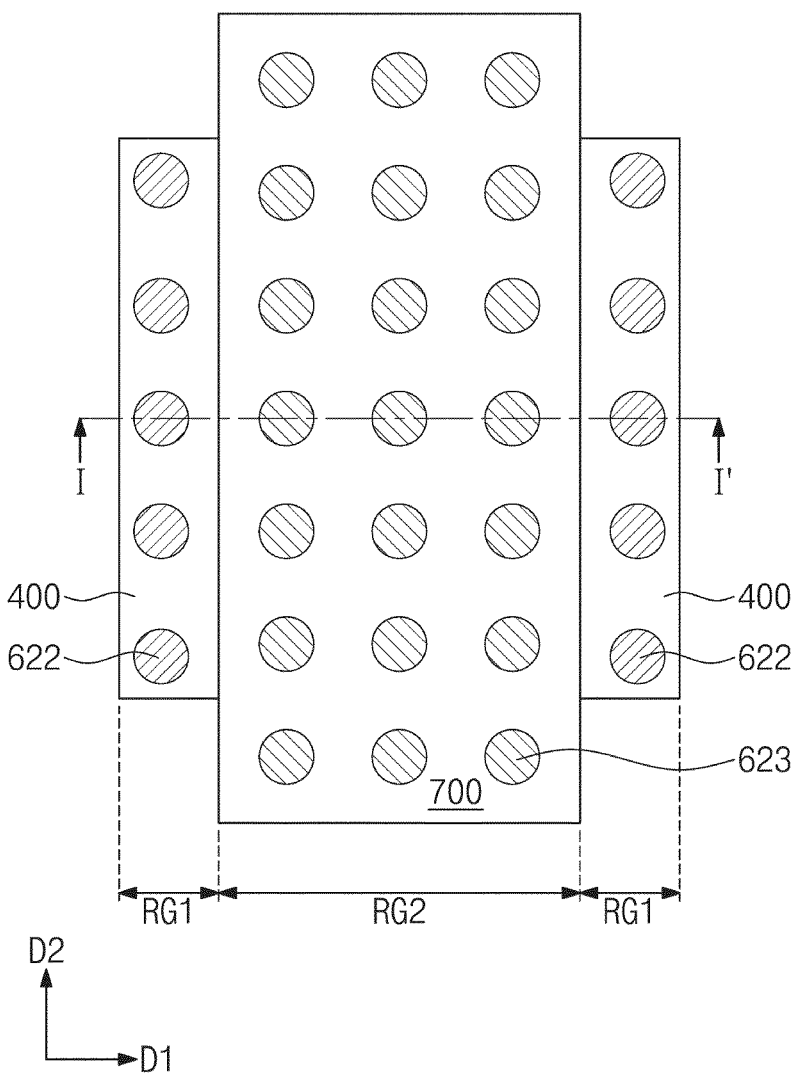

FIGS. 1 to 3 illustrate cross-sectional views showing a semiconductor package according to some embodiments of the present inventive concepts. FIG. 4 illustrates an enlarged cross-sectional view of section A depicted in FIG. 1, showing a semiconductor package according to some embodiments of the present inventive concepts. FIGS. 5 and 6 illustrate plan views showing a semiconductor package according to some embodiments of the present inventive concepts. For convenience of description, FIGS. 5 and 6 only depict a second semiconductor, a third semiconductor chip, and an arrangement of first and second pads.

Referring to FIG. 1, a package substrate 100 may be provided. The package substrate 100 may be a redistribution substrate. For example, the package substrate 100 may include two or more substrate wiring layers that are stacked on each other. In this description, the term "substrate wiring layer" may indicate a wiring layer obtained by patterning each of one dielectric material layer and one conductive material layer. For example, one substrate wiring layer may have conductive patterns, or horizontally extending wiring lines, that do not vertically overlap each other. The substrate wiring layer may include first dielectric patterns 110 and first conductive patterns 120 in the first dielectric patterns 110. The first conductive patterns 120 in one substrate wiring layer may be electrically connected to the first conductive patterns 120 in another substrate wiring layer adjacent to the one substrate wiring layer.

The first dielectric patterns 110 may include an inorganic dielectric layer such as silicon oxide (SiOx) or silicon nitride (SiNx). Alternatively, the first dielectric patterns 110 may include a polymeric material. The first dielectric patterns 110 may include a dielectric polymer or a photo-imageable dielectric (PID). For example, the photo-imageable dielectric may include at least one selected from photosensitive polyimide, polybenzoxazole (PBO), phenolic polymers, and benzocyclobutene polymers.

The first conductive patterns 120 may be provided on the first dielectric patterns 110. The first conductive patterns 120 may each have a damascene structure. For example, the first conductive patterns 120 may each include a head part and a tail part that are connected into a single unitary piece. The head part may be a pad or wiring portion that allows a wiring line in the package substrate 100 to expand horizontally. The tail part may be a via portion that allows a wiring line in the package substrate 100 to vertically connect with a certain component. The first conductive patterns 120 may each have an inverse T-shaped cross section. For each of the substrate wiring layers, the head part of the first conductive pattern 120 may be embedded in an upper portion of the first dielectric pattern 110, and a top surface of the head part in the first conductive pattern 120 may be exposed on a top surface of the first dielectric pattern 110. For each of the substrate wiring layers, the tail part of the first conductive pattern 120 may extend from the top surface of the head part, and may penetrate the first dielectric pattern 110 of an overlaying substrate wiring layer to be coupled to the head part of another first conductive pattern 120. A top surface of the tail part in an uppermost first conductive pattern 120 may be exposed on the top surface of the first dielectric pattern 110 in an uppermost one of the substrate wiring layers. The first conductive patterns 120 may include a conductive material. For example, the first conductive patterns 120 may include copper (Cu). The first conductive patterns 120 may redistribute a first semiconductor chip 300 mounted on the package substrate 100.

FIG. 1 depicts that the tail part of the first conductive pattern 120 protrudes onto the head part of the first conductive pattern 120, but the present inventive concepts are not limited thereto. The first conductive patterns 120 may each have a T shape in which the tail part is connected to a bottom surface of the head part. For example, a top surface of the head part in the first conductive pattern 120 may be exposed on a top surface of the first dielectric pattern 110, and a bottom surface of the tail part in the first conductive pattern 120 may be exposed on a bottom surface of the first dielectric pattern 110. In this case, the tail part may be coupled to the head part of the first conductive pattern 120 in an underlying substrate wiring layer.

Although not shown, a barrier layer may be interposed between the first dielectric pattern 110 and the first conductive pattern 120. The barrier layer may conformally cover lateral and bottom surfaces of the first conductive pattern 120. A range of about 50 Å to about 1,000 Å may be given as a thickness of the barrier layer, or a thickness of a gap between the first conductive pattern 120 and the first dielectric pattern 110. The barrier layer may include metal such as titanium (Ti) or tantalum (Ta) or metal nitride such as titanium nitride (TiN) or tantalum nitride (TaN).

A semiconductor package may have a fan-out structure by the package substrate 100. The first conductive pattern 120 may be connected to substrate pads 125 on a bottom surface of the package substrate 100. The substrate pads 125 may be pads on which external terminals 130 are disposed. The substrate pads 125 may penetrate the first dielectric pattern 110 at a bottom position and may be coupled to the first conductive patterns 120. Although not shown, a protection layer may be disposed on the bottom surface of the package substrate 100. The protection layer may cover the first dielectric patterns 110 and the first conductive patterns 120, while exposing the substrate pads 125. The protection layer may include a dielectric polymer such as an epoxy-based polymer, an Ajinomoto build-up film (ABF), an organic material, or an inorganic material.

A connection substrate 200 may be disposed on the package substrate 100. The connection substrate 200 may have an opening 202 that penetrates therethrough. For example, the opening 202 may have an open hole that connects top and bottom surfaces of the connection substrate 200. The bottom surface of the connection substrate 200 may be in contact with a top surface of the package substrate 100. The connection substrate 200 may include a base layer 210 and a conductive part 220 that is a wiring pattern provided in the base layer 210. For example, the base layer 210 may include silicon oxide. Compared with the opening 202, the conductive part 220 may be disposed on an outer portion of the connection substrate 200. The conductive part 220 may include lower pads 222, vias 224, and upper pads 226. The lower pads 222 may be disposed on a lower portion of the connection substrate 200. The lower pads 222 may be disposed on the bottom surface of the connection substrate 200. The lower pads 222 may be electrically connected to the first conductive patterns 120 of the package substrate 100. For example, the lower pads 222 of the connection substrate 200 may be in contact with the package substrate 100, and the tail part of the uppermost first conductive pattern 120 in the package substrate 100 may penetrate an uppermost first dielectric pattern 110 to be coupled to the lower pads 222. The upper pads 226 may be disposed on the top surface of the connection substrate 200. The vias 224 may penetrate the base layer 210 and may electrically connect the lower pads 222 to the upper pads 226.

FIG. 1 depicts that the first conductive pattern 120 of the package substrate 100 is directly coupled to the lower pads 222 of the connection substrate 200, but the present inventive concepts are not limited thereto. The package substrate 100 may be provided on its top surface with pads connected to the uppermost first conductive pattern 120, and the connection substrate 200 may be mounted on the pads of the package substrate 100 through terminals such as solder ball or solder bumps provided on the lower pads 222 of the connection substrate 200. The following description will focus on the embodiment of FIG. 1.

A chip stack CS may be disposed on the package substrate 100. The chip stack CS may be disposed in the opening 202 of the connection substrate 200. When viewed in a plan view, the chip stack CS may have a planar shape smaller than that of the opening 202. For example, the chip stack CS may be spaced apart from an inner wall of the opening 202. The chip stack CS may include a first semiconductor chip 300 and a second semiconductor chip 400 that are stacked on each other.

The first semiconductor chip 300 may be disposed on the package substrate 100. When viewed in a plan view, the first semiconductor chip 300 may have a planar shape smaller than that of the package substrate 100. For example, the first semiconductor chip 300 may have a width less than that of the package substrate 100. The first semiconductor chip 300 may be disposed in a face-down state. The first semiconductor chip 300 may have a bottom surface 300a directed toward the package substrate 100 and a top surface 300b opposite to the bottom surface 300a. The bottom surface 300a may be an active surface of the first semiconductor chip 300. The top surface 300b may be an inactive surface of the first semiconductor chip 300. The bottom surface 300a of the first semiconductor chip 300 may be in contact with the top surface of the package substrate 100. The first semiconductor chip 300 may include first chip pads 310 disposed on a lower portion thereof. The first chip pads 310 may be electrically connected to the first conductive patterns 120 of the package substrate 100. For example, the first chip pads 310 of the first semiconductor chip 300 may be in contact with the package substrate 100, and the tail part of the uppermost first conductive pattern 120 in the package substrate 100 may penetrate the uppermost first dielectric pattern 110 to be coupled to the first chip pads 310. The first semiconductor chip 300 may include a semiconductor material, such as silicon (Si). The first semiconductor chip 300 may be a logic chip. For example, the first semiconductor chip 300 may be an application processor (AP) chip.

FIG. 1 depicts that the first conductive pattern 120 of the package substrate 100 is directly coupled to the first chip pads 310 of the first semiconductor chip 300, but the present inventive concepts are not limited thereto. The package substrate 100 may be provided on its top surface with pads connected to the uppermost first conductive pattern 120, and the first semiconductor chip 300 may be mounted on the pads of the package substrate 100 through terminals such as solder balls or solder bumps provided on the first chip pads 310. The following description will focus on the embodiment of FIG. 1.

The second semiconductor chip 400 may be disposed on the first semiconductor chip 300. The second semiconductor chip 400 may have a second width (see w2 of FIG. 4) less than a first width of the first semiconductor chip 300. The second semiconductor chip 400 may vertically overlap the first semiconductor chip 300. When viewed in a plan view, the second semiconductor chip 400 may be disposed inside the first semiconductor chip 300. The present inventive concepts, however, are not limited thereto. The second width w2 of the second semiconductor chip 400 may be the same as the first width of the first semiconductor chip 300. In this case, the second semiconductor chip 400 may have lateral surfaces that are vertically aligned and coplanar with those of the first semiconductor chip 300. For example, the second semiconductor chip 400 may be vertically aligned with the first semiconductor chip 300. The second semiconductor chip 400 may be disposed in a face-up state. For example, the second semiconductor chip 400 may have a bottom surface 400a directed toward the package substrate 100 and a top surface 400b opposite to the bottom surface 400a. The bottom surface 400a may be an inactive surface of the second semiconductor chip 400. The top surface 400b may be an active surface of the second semiconductor chip 400. The second semiconductor chip 400 may include second chip pads 410 disposed on an upper portion thereof. The second semiconductor chip 400 may include a semiconductor material, such as silicon (Si). The second semiconductor chip 400 may be a memory chip. For example, the second semiconductor chip 400 may be a NAND Flash memory.

The second semiconductor chip 400 may be attached to the first semiconductor chip 300. The bottom surface 400a of the second semiconductor chip 400 may face the top surface 300b of the first semiconductor chip 300. An adhesion layer 404 may be provided on at least one selected from the bottom surface 400a of the second semiconductor chip 400 and the top surface 300b of the first semiconductor chip 300. The adhesion layer 404 may attach the bottom surface 400a of the second semiconductor chip 400 to the top surface 300b of the first semiconductor chip 300. The adhesion layer 404 may rigidly adhere the second semiconductor chip 400 to the first semiconductor chip 300.

According to some embodiments, as shown in FIG. 2, the bottom surface 400a of the second semiconductor chip 400 may be directly bonded to the top surface 300b of the first semiconductor chip 300. For example, the top surface 300b or an inactive surface of the first semiconductor chip 300 may be coupled to the bottom surface 400a or an inactive surface of the second semiconductor chip 400. The first and second semiconductor chips 300 and 400 may include the same material (e.g., silicon (Si)). Nitrogen (N) or oxygen (O) may be contained in a partial upper portion of the first semiconductor chip 300 and in a partial lower portion of the second semiconductor chip 400. For example, the partial upper portion of the first semiconductor chip 300 may include oxide, nitride, or oxynitride of a material included in the first semiconductor chip 300, and the partial lower portion of the second semiconductor chip 400 may include oxide, nitride, or oxynitride of a material included in the second semiconductor chip 400. A hybrid bonding may be established between the first semiconductor chip 300 and the second semiconductor chip 400. In this description, the term "hybrid bonding" may denote that the two components of the same kind are merged at an interface therebetween. For example, an upper portion of the first semiconductor chip 300 and a lower portion of the second semiconductor chip 400 may have a continuous configuration, and as shown in FIG. 2, an invisible interface IF may be provided between the first semiconductor chip 300 and the second semiconductor chip 400. The following description will focus on the embodiment of FIG. 1.

A dielectric layer 500 may be disposed on the package substrate 100. The dielectric layer 500 may fill a space between the connection substrate 200 and the chip stack CS. For example, the dielectric layer 500 fills a gap between the connection substrate 200 and the first semiconductor chip 300 and between the connection substrate 200 and the second semiconductor chip 400. The dielectric layer 500 may have a lowermost surface in contact with a top surface of the package substrate 100. In this case, the lowermost surface of the dielectric layer 500 may be located at the same level as that of the bottom surface of the connection substrate 200 and that of the bottom surface 300a of the first semiconductor chip 300. An upper portion 502 of the dielectric layer 500 may cover the top surface of the connection substrate 200 and the top surface of the second semiconductor chip 400. The dielectric layer 500 may include a dielectric material. For example, the dielectric layer 500 may include an epoxy molding compound (EMC).

A redistribution layer 600 may be disposed on the dielectric layer 500. The redistribution layer 600 may cover the connection substrate 200 and the chip stack CS. The redistribution layer 600 may be in contact with a top surface of the dielectric layer 500. The redistribution layer 600 may be a redistribution substrate. For example, the redistribution layer 600 may include one substrate wiring layer. The substrate wiring layer may include a second dielectric pattern 610 and a second conductive pattern 620 in the second dielectric pattern 610.

The second conductive pattern 620 may be provided on the dielectric layer 500. The second conductive pattern 620 may have a damascene structure. For example, the second conductive pattern 620 may have a head part 622, 623, 624, and 626 and a tail part 628 that are connected into a single unitary piece. The head part 622, 623, 624, and 626 may be a pad or wiring portion that allows a wiring line in the redistribution layer 600 to expand horizontally. The head part 622, 623, 624, and 626 will be discussed in detail below. The tail part 628 may be a via portion for vertical connection of the redistribution layer 600. Hereinafter, the tail part 628 may be called redistribution via. The second conductive pattern 620 may have a T-shaped cross section. The head part of the second conductive pattern 620 may be provided on the top surface of the dielectric layer 500 and may be covered with the second dielectric pattern 610. The tail part of the second conductive pattern 620 may penetrate the dielectric layer 500 to be coupled to the connection substrate 200 or the second semiconductor chip 400. The second conductive pattern 620 may include a conductive material. For example, the second conductive pattern 620 may include copper (Cu).

The head part 622, 623, 624, and 626 of the second conductive pattern 620 may include first pads 622, the second pads 623, third pads 624, and connection lines 626.

The first pads 622 may be pads to which the second semiconductor chip 400 is connected. For example, one or more tail part(s) 628a (referred to hereinafter as first redistribution vias) of the redistribution vias 628 may extend from bottom surfaces of the first pads 622 so as to vertically penetrate the dielectric layer 500, thereby being coupled to the second pads 410 of the second semiconductor chip 400. In this case, the first redistribution vias 628a may correspond to chip terminals for coupling the second semiconductor chip 400 to the first pads 622.

The third pads 624 may be pads for connecting the second conductive pattern 620 to the connection substrate 200. For example, one or more tail part(s) 628b (referred to hereinafter as second redistribution vias) of the redistribution vias 628 may extend from bottom surfaces of the third pads 624 so as to vertically penetrate the dielectric layer 500, thereby being coupled to the upper pads 226 of the connection substrate 200.

The second conductive pattern 620 may redistribute the second semiconductor chip 400 mounted on a bottom surface of the redistribution layer 600. For example, the first pads 622 and the third pads 624 may be connected through the connection lines 626. The second semiconductor chip 400 may be electrically connected to the connection substrate 200 through the first redistribution vias 628a, the first pads 622, the connection lines 626, the third pads 624, and the second redistribution vias 628b. The first pads 622, the connection lines 626, and the third pads 624 may be located at the same level from the package substrate 100. For example, the first pads 622, the connection lines 626, and the third pads 624 may be provided in one substrate wiring layer, and thus there may be a small length of electrical connection through the first pads 622, the connection lines 626, and the third pads 624.

The second pads 623 may be pads to which is connected a third semiconductor chip 700 which will be discussed below. A configuration and electrical connection of the second pads 623 will be discussed below together with the third semiconductor chip 700.

The second dielectric pattern 610 may be provided on the dielectric layer 500. On the dielectric layer 500, the second dielectric pattern 610 may cover the second conductive pattern 620. The second conductive pattern 620 may be embedded in the dielectric layer 500 and the second dielectric pattern 610. For example, the upper portion 502, which is included in the dielectric layer 500, that covers the top surface of the connection substrate 200 and the top surface of the second semiconductor chip 400 may have a role as a dielectric pattern of the redistribution layer 600 that encapsulates the second conductive pattern 620. In addition, the second dielectric pattern 610 may serve as a protection layer that covers and protects the second conductive pattern 620. In this case, one substrate wiring layer may be constituted by the upper portion 502 of the dielectric layer 500, the second dielectric pattern 610, and the second conductive pattern 620. The second dielectric pattern 610 may have openings that expose the second pads 623. The second dielectric pattern 610 may include an inorganic dielectric layer, such as silicon oxide (SiOx) or silicon nitride (SiNx). Alternatively, the second dielectric pattern 610 may include a polymeric material. The second dielectric pattern 610 may include a dielectric polymer or a photo-imageable dielectric (PID). For example, the photo-imageable dielectric may include at least one selected from photosensitive polyimide, polybenzoxazole (PBO), phenolic polymers, and benzocyclobutene polymers.

According to some embodiments, as shown in FIG. 3, the dielectric layer 500 may further include a third dielectric pattern 630. The third dielectric pattern 630 may be disposed on the dielectric layer 500. The third dielectric pattern 630 may be in contact with the top surface of the dielectric layer 500. The third dielectric pattern 630 may be a dielectric pattern of the redistribution layer 600 in which the second conductive pattern 620 is provided. For example, the second conductive pattern 620 may be provided on the third dielectric pattern 630, and the third dielectric pattern 630 may be provided thereon with the second dielectric pattern 610 that covers the second conductive pattern 620. One substrate wiring layer may be constituted by the third dielectric pattern 630, the second dielectric pattern 610, and the second conductive pattern 620. The second redistribution vias 628b connected to the third pads 624 may extend from the bottom surfaces of the third pads 624 so as to vertically penetrate the third dielectric pattern 630 and the dielectric layer 500, thereby being coupled to the upper pads 226 of the connection substrate 200. The first redistribution vias 628a connected to the first pads 622 may extend from the bottom surfaces of the first pads 622 so as to vertically penetrate the third dielectric pattern 630 and the dielectric layer 500, thereby being coupled to the second chip pads 410 of the second semiconductor chip 400. The third dielectric pattern 630 may include an inorganic dielectric layer, such as silicon oxide (SiOx) or silicon nitride (SiNx). Alternatively, the third dielectric pattern 630 may include a polymeric material. The third dielectric pattern 630 may include a dielectric polymer or a photo-imageable dielectric (PID). For example, the photo-imageable dielectric may include at least one selected from photosensitive polyimide, polybenzoxazole (PBO), phenolic polymers, and benzocyclobutene polymers. The following description will focus on the embodiment of FIG. 1.

A third semiconductor chip 700 may be disposed on the redistribution layer 600. The third semiconductor chip 700 may be disposed in a face-down state. The third semiconductor chip 700 may have a bottom surface 700a directed toward the redistribution layer 600 and a top surface 700b opposite to the bottom surface 700a. The bottom surface 700a may be an active surface of the third semiconductor chip 700. The top surface 700b may be an inactive surface of the third semiconductor chip 700. The third semiconductor chip 700 may have a third width (see w3 of FIG. 4) less than the width w2 of the second semiconductor chip 400. As shown in FIGS. 4 and 5, the third semiconductor chip 700 may vertically overlap the second semiconductor chip 400. The third semiconductor chip 700 may have a planar shape smaller than that of the second semiconductor chip 400, and when viewed in a plan view, the third semiconductor chip 700 may be positioned inside a perimeter of the second semiconductor chip 400. Alternatively, as shown in FIGS. 4 and 6, the third semiconductor chip 700 may protrude from one or opposite sides of the second semiconductor chip 400, in a plan view. For example, the second semiconductor chip 400 may have a second width w2 in a first direction D1 greater than a third width w3 in the first direction D1 of the third semiconductor chip 700, and may have a width in a second direction D2 less than a width in the second direction D2 of the third semiconductor chip 700, which second direction D2 intersects the first direction D1. In this case, the third semiconductor chip 700 may have a planar shape that extends in the second direction D2 and may run in the second direction D2 across the second semiconductor chip 400. The following will focus on the embodiment of FIGS. 4 and 5. The third semiconductor chip 700 may include a peripheral circuit chip, a logic chip, or a memory chip. For example, the third semiconductor chip 700 may include a power management integrated circuit (PMIC).

The third semiconductor chip 700 may be mounted on the redistribution layer 600. For example, the third semiconductor chip 700 may include third chip pads 710 disposed on a lower portion thereof. The third chip pads 710 may be coupled through chip terminals 720 to the second pads 623 of the redistribution layer 600. The chip terminals 720 may include solder balls or solder bumps.

The second conductive pattern 620 may redistribute the third semiconductor chip 700 mounted on the top surface of the redistribution layer 600. For example, the second pads 623 and the third pads 624 may be connected through the connection lines 626. The third semiconductor chip 700 may be electrically connected to the connection substrate 200 through the chip terminals 720, the second pads 623, the connection lines 626, the third pads 624, and the second redistribution vias 628b. The second pads 623, the connection lines 626, and the third pads 624 may be located at the same level from the package substrate 100. For example, one substrate wiring layer may be provided therein with the second pads 623, the connection lines 626, and the third pads 624, and accordingly there may be a small length of electrical connection through the second pads 623, the connection lines 626, and the third pads 624. Therefore, there may be a small length of electrical connection between the second semiconductor chip 400 and the third semiconductor chip 700 that are respectively mounted on the top surface and the bottom surface of the redistribution layer 600.

According to some embodiments, a single substrate wiring layer may be provided thereon with the first pads 622 on which the second semiconductor chip 400 is mounted and with the second pads 623 on which the third semiconductor chip 700 is mounted. The second semiconductor chip 400 and the third semiconductor chip 700 may each be coupled to the second conductive pattern 620 through terminals (e.g., the first redistribution vias 628a and the chip terminal 720), and the second conductive pattern 620 may constitute one layer on the top surface of the dielectric layer 500. A single substrate wiring layer may be provided therein with the first pads 622, the second pads 623, the third pads 624, and the connection lines 626, and a small length of electrical connection through the first pads 622, the second pads 623, the third pads 624, and the connection lines 626. For example, as a single substrate wiring layer is provided therein with an electrical connection for the second semiconductor chip 400 and an electrical connection for the third semiconductor chip 700, there may be small lengths of the electrical connections.

Moreover, the first, second, and third semiconductor chips 300, 400, and 700 may be formed to vertically overlap each other, and thus may have their small occupied areas when viewed in a plan view. Furthermore, the second and third semiconductor chips 400 and 700 may be redistributed by using one substrate wiring layer, and thus the redistribution layer 600 may have a small thickness. As a result, it may be possible to provide a compact-sized semiconductor package. The following will describe in detail an arrangement and connection of the second conductive pattern 620 for redistributing the second and third semiconductor chips 400 and 700.

Referring to FIGS. 1, 4, and 5, the redistribution layer 600 may have a first region RG1 on which the first pads 622 are provided and a second region RG2 on which the second pads 623 are provided. The first region RG1 may surround the second region RG2. The second region RG2 may be positioned below the third semiconductor chip 700. For example, the second region RG2 may be located between the second semiconductor chip 400 and the third semiconductor chip 700. The second region RG2 may include a zone where the second semiconductor chip 400 overlaps the third semiconductor chip 700. The first region RG1 may include a zone where the second semiconductor chip 400 does not overlap the third semiconductor chip 700. For example, when viewed in a plan view, the first region RG1 may be disposed beside of the third semiconductor chip 700. As shown in FIG. 5, the first pads 622 may be disposed to surround all of the second pads 623.

According to some embodiments of the present inventive concepts, the third semiconductor chip 700 with a small size may be mounted on the second pads 623 positioned in the second region RG2 or an inner region. In addition, the first pads 622 may be disposed outside the second region RG2, and the second semiconductor chip 400 with a large size may be mounted on the first pads 622. For example, the second chip pads 410 of the second semiconductor chip 400 may be disposed on an outer portion of the second semiconductor chip 400, and when viewed in a plan view, may be located beside of the third semiconductor chip 700. As discussed above, the first pads 622 and the third pads 633, on which the second semiconductor chip 400 and the third semiconductor chip 700 are respectively mounted, may be disposed on different regions that are spaced apart from each other. Therefore, although the second and third semiconductor chips 400 and 700 are respectively mounted on the bottom and top surfaces of the redistribution layer 600 so as to vertically overlap each other, the first pads 622 and the second pads 623 may be located at the same level, and the second semiconductor chip 400 and the third semiconductor chip 700 may be redistributed by using one substrate wiring layer. For example, there may be a reduction in the number of substrate wiring layers that are required for the redistribution layer 600, and a semiconductor package may be provided to have a small thickness and a compact size. In addition, the second and third semiconductor chips 400 and 700 may be respectively mounted on the bottom and top surfaces of the redistribution layer 600 so as to vertically overlap each other, and the first, second, and third semiconductor chips 300, 400, and 700 may vertically overlap each other, which may result in a reduction in occupied area of the first, second, and third semiconductor chips 300, 400, and 700 and in a decrease in size of a semiconductor package.

According to some embodiments, referring to FIGS. 1, 4, and 6, the second width w2 in the first direction D1 of the second semiconductor chip 400 may be greater than the third width w3 in the first direction D1 of the third semiconductor chip 700, and a width in the second direction D2 of the second semiconductor chip 400 may be less than a width in the second direction D2 of the third semiconductor chip 700. In this case, the third semiconductor chip 700 may have a planar shape that extends in the second direction D2 and may run in the second direction D2 across the second semiconductor chip 400. The second region RG2 may be a zone positioned below the third semiconductor chip 700. For example, the second region RG2 may include a zone where the second semiconductor chip 400 overlaps the third semiconductor chip 700, and may also include a zone where the second semiconductor chip 400 does not overlap the third semiconductor chip 700. The first region RG1 may be positioned on opposite sides in the first direction D1 of the second region RG2. For example, the first region RG1 may include a zone where the second semiconductor chip 400 does not overlap the third semiconductor chip 700. When viewed in a plan view, the second semiconductor chip 400 may protrude outwardly from one side of the third semiconductor chip 700, and may be coupled to the redistribution layer 600 on the first region RG1 where the second semiconductor chip 400 does not overlap the third semiconductor chip 700. The third semiconductor chip 700 may be coupled to the redistribution layer 600 on the second region RG2 where there is no electrical connection for the second semiconductor chip 400.

According to some embodiments of the present inventive concepts, the third semiconductor chip 700 is formed to completely overlap the second semiconductor chip 400, and moreover the second semiconductor chip 400 and the third semiconductor chip 700 may be formed to completely overlap the first semiconductor chip 300, with the result that a semiconductor package may decrease in planar area. In addition, because the second pads 623 and the first pads 622 are provided by dividing a zone where the second and third semiconductor chips 400 and 700 overlap each other from a zone where the second and third semiconductor chips 400 and 700 do not overlap each other, the first pads 622 and the second pads 623 may be located at the same level although the second and third semiconductor chips 400 and 700 are respectively mounted on the bottom and top surfaces of the redistribution layer 600 so as to vertically overlap each other. Therefore, the second semiconductor chip 400 and the third semiconductor chip 700 may be redistributed by using one substrate wiring layer, and a compact-sized thin semiconductor package may be provided in which the first, second, and third semiconductor chips 300, 400, and 700 have their small occupied areas.

Figure 7:
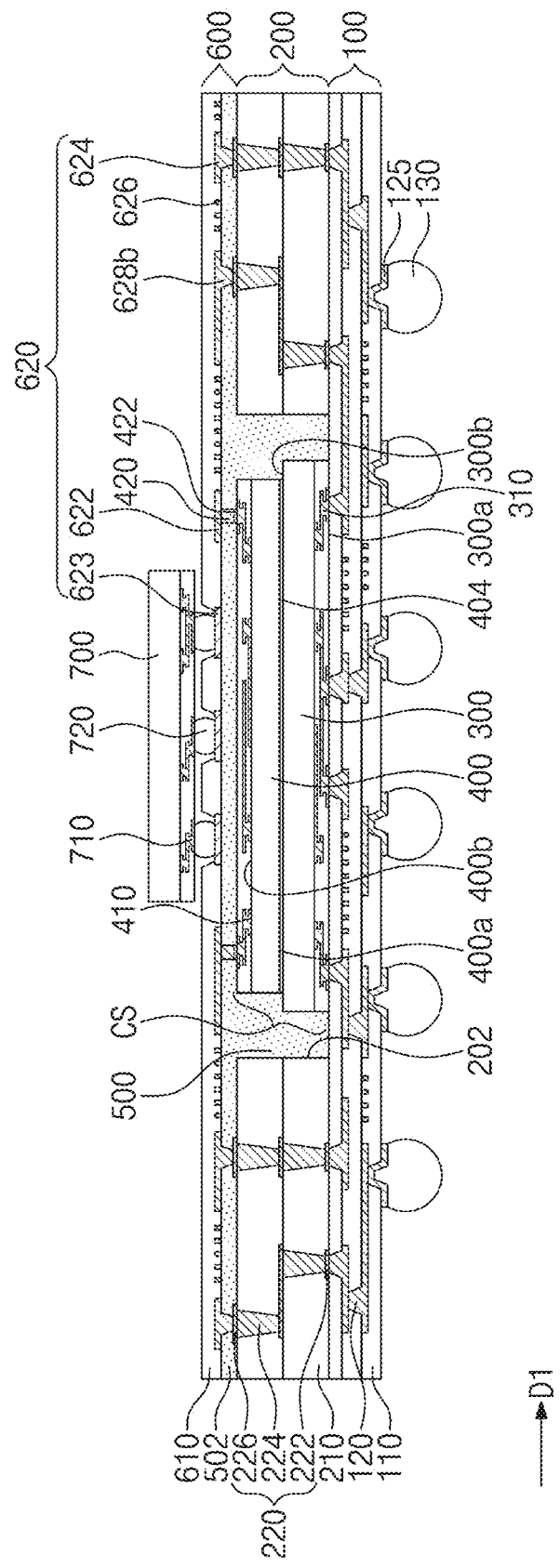
FIGS. 7 to 9 illustrate cross-sectional views showing a semiconductor package according to some embodiments of the present inventive concepts.

FIG. 7 illustrates a cross-sectional view showing a semiconductor package according to some embodiments of the present inventive concepts. In the embodiments that follow, components the same as those discussed with reference to FIGS. 1 to 6 are allocated the same reference numerals thereto, and a repetitive explanation thereof will be omitted or abridged for convenience of description. The following description will focus on differences between the embodiments of FIGS. 1 to 6 and other embodiments discussed below.

FIGS. 1 to 6 depict that the redistribution layer 600 is coupled through the first redistribution via 628a to the second semiconductor chip 400, but the present inventive concepts are not limited thereto.

Referring to FIG. 7, chip bumps 420 may be provided on the top surface 400b of the second semiconductor chip 400. The chip bumps 420 may be electrically connected to an integrated circuit of the second semiconductor chip 400. For example, the chip bumps 420 may be coupled to the second chip pads 410 that are exposed on the top surface 400b of the second semiconductor chip 400. The chip bumps 420 may be positioned on the first region RG1. For example, when viewed in a plan view, the chip bumps 420 may be disposed beside the third semiconductor chip 700. The chip bumps 420 may have their positions that correspond to those of the first pads 622. The chip bumps 420 may each have a thickness of about 0.1 mm to about 10 mm. The chip bumps 420 may each have a width that is uniform regardless of distance from the second chip pad 410. The chip bumps 420 may have their top surfaces that are exposed on the top surface of the dielectric layer 500. The chip bumps 420 may include copper (Cu).

The chip bumps 420 may each include a seed layer 422. The seed layers 422 may cover bottom surfaces of the chip bumps 420. The seed layers 422 may be interposed between the chip bumps 420 and the second chip pads 410 of the second semiconductor chip 400. Alternatively, the seed layers 422 may cover the bottom surfaces or lateral surfaces of the chip bumps 420. The seed layers 422 may extend onto the lateral surfaces of the chip bumps 420 from between the chip bumps 420 and the second chip pads 410 of the second semiconductor chip 400.

The first pads 622 of the second conductive pattern 620 in the redistribution layer 600 may be connected to the second semiconductor chip 400. For example, the bottom surfaces of the first pads 622 may be exposed on a bottom surface of the second dielectric pattern 610. The top surface of the dielectric layer 500 may be in contact with the bottom surface of the redistribution layer 600, and in this case, the chip bumps 420 exposed to the top surface of the dielectric layer 500 may be in contact with the first pads 622 exposed on the bottom surface of the redistribution layer 600. For example, the chip bumps 420 and the first pads 622 may be connected to each other on an interface between the dielectric layer 500 and the redistribution layer 600.

Figure 8:
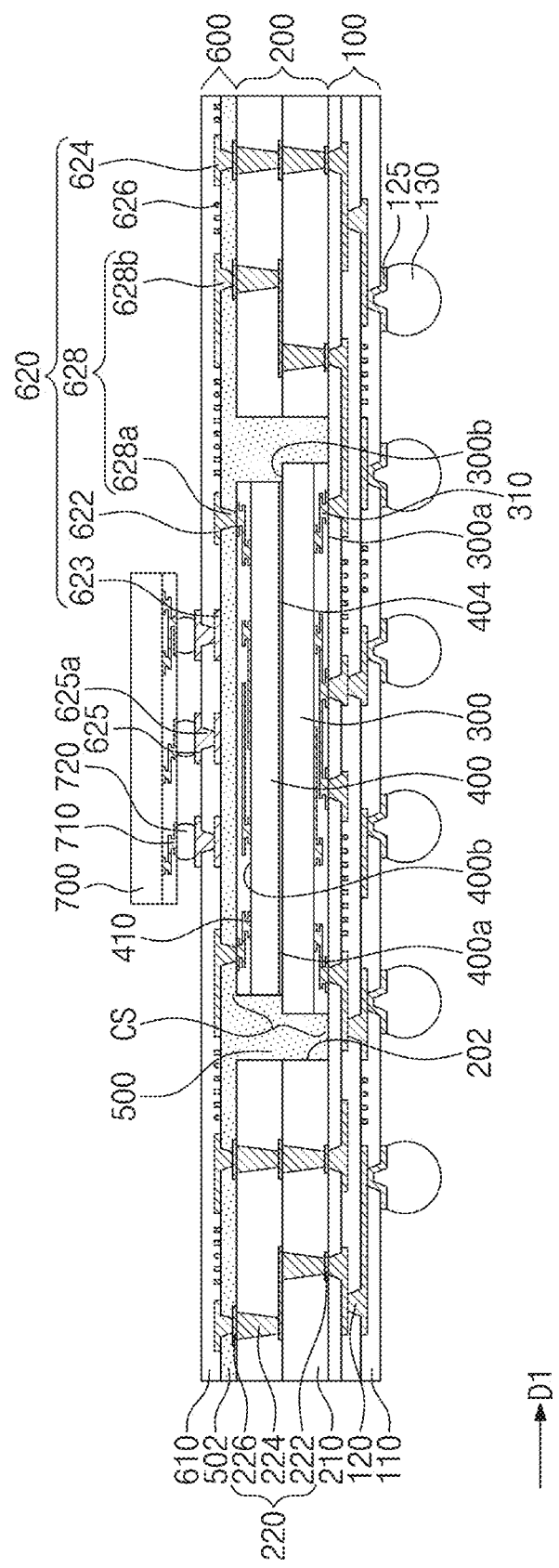

FIG. 8 illustrates a cross-sectional view showing a semiconductor package according to some embodiments of the present inventive concepts.

Referring to FIG. 8, the second pads 623 of the redistribution layer 600 may be embedded in the second dielectric pattern 610.

The redistribution layer 600 may further include additional pads 625. The additional pads 625 may be provided on a top surface of the second dielectric pattern 610. Some of the additional pads 625 may be coupled to the second pads 623 through third redistribution vias 625a that vertically penetrates the second dielectric pattern 610. The additional pads 625 may be positioned on the second region RG2. For example, when viewed in a plan view, the additional pads 625 may be disposed below the third semiconductor chip 700. The additional pads 625 may have their positions that correspond to those of the second pads 623.

The third semiconductor chip 700 may be coupled through chip terminals 720 to the additional pads 625 of the redistribution layer 600. The third semiconductor chip 700 may be coupled to the second pads 623 through the chip terminals 720, the additional pads 625, and the third redistribution vias 625a.

Figure 9:
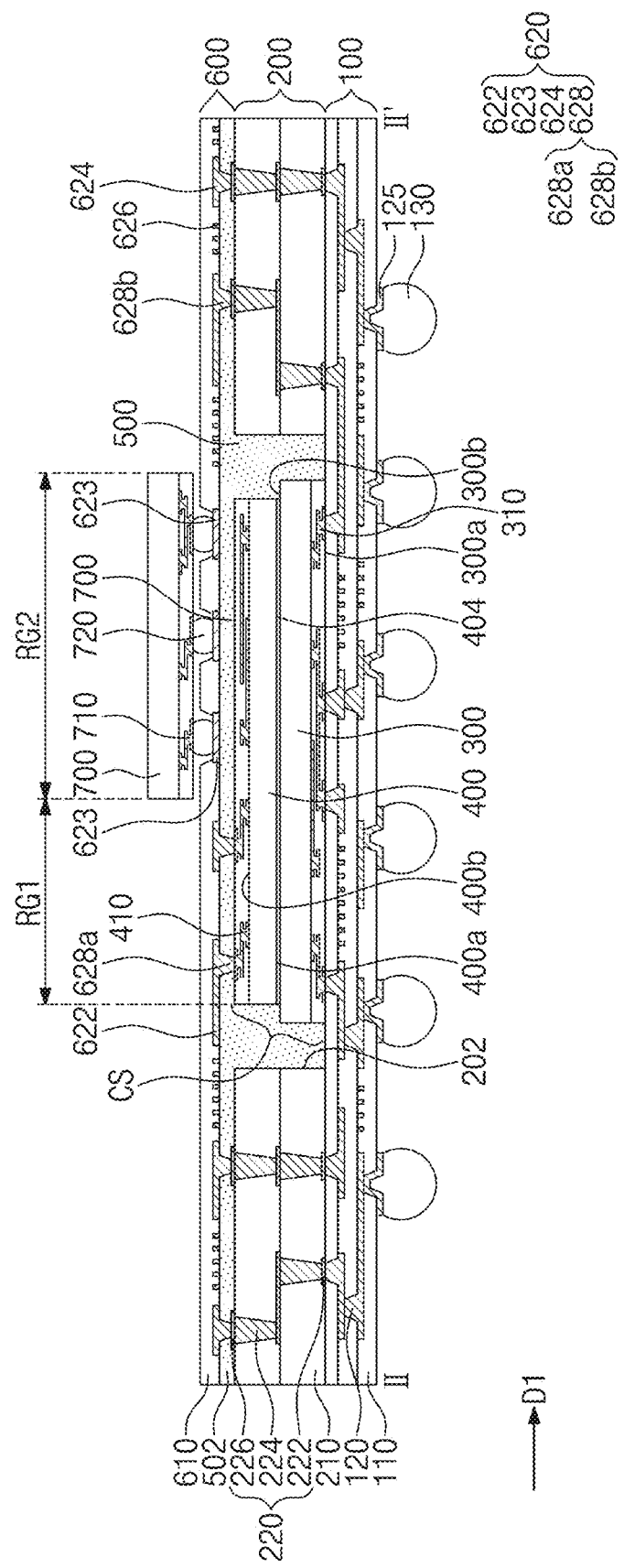
Figure 10:
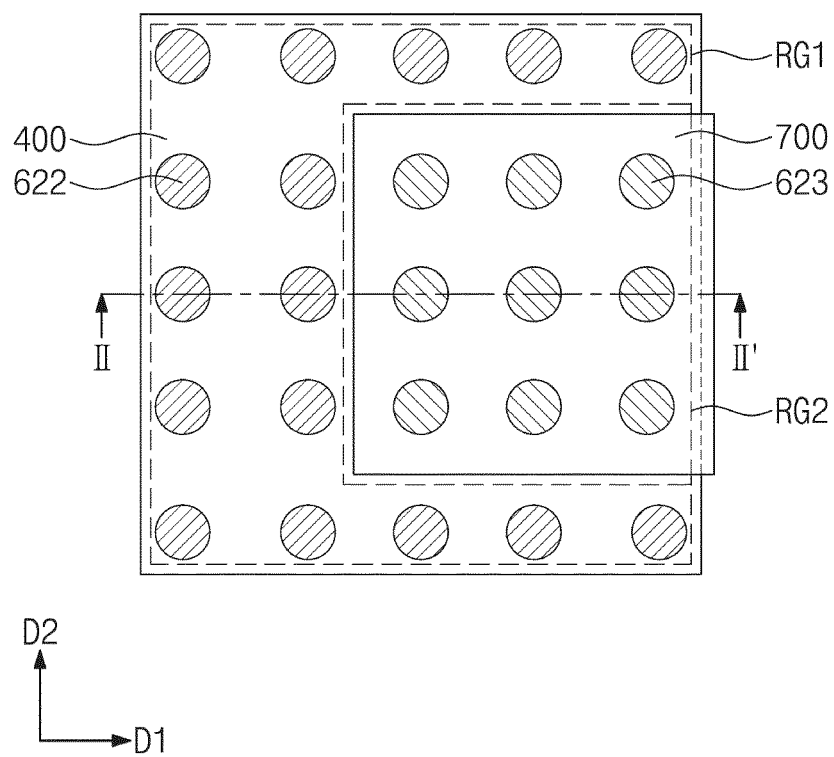
FIGS. 10 to 12 illustrate plan views showing a semiconductor package according to some embodiments of the present inventive concepts.
Figure 11:
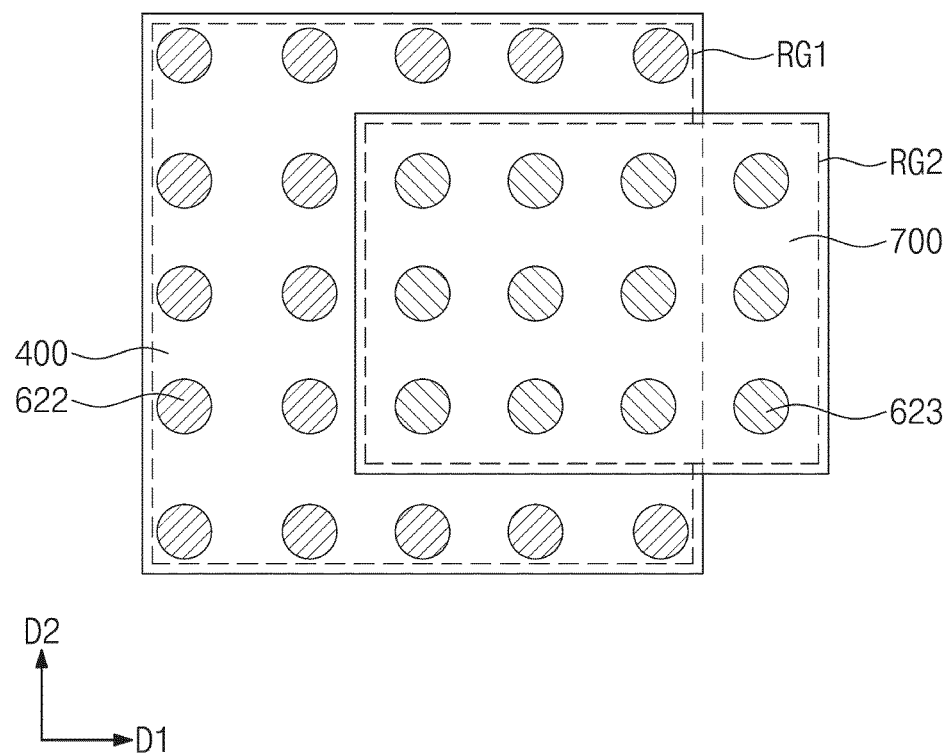
Figure 12:
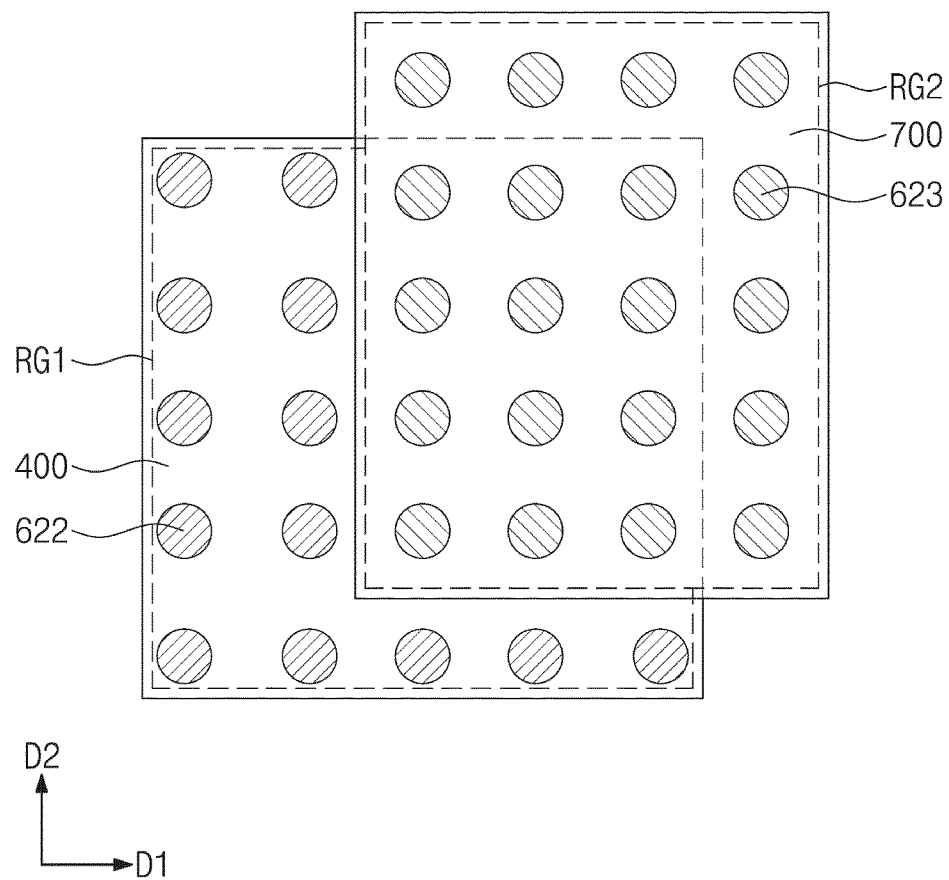

FIG. 9 illustrates a cross-sectional view showing a semiconductor package according to some embodiments of the present inventive concepts. FIGS. 10 to 12 illustrate plan views showing a semiconductor package according to some embodiments of the present inventive concepts. For convenience of description, FIGS. 10 to 12 only depict a second semiconductor, a third semiconductor chip, and an arrangement of first and second pads.

Referring to FIGS. 9 and 10, the third semiconductor chip 700 may be disposed to overlap at least a portion of the second semiconductor chip 400, and the third semiconductor chip 700 may have one lateral surface aligned with that of the second semiconductor chip 400 or when viewed in a plan view may be disposed to protrude from one lateral surface of the second semiconductor chip 400. Therefore, the second region RG2 where the second and third semiconductor chips 400 and 700 overlap each other may not be fully surrounded by the first region RG1 where the second and third semiconductor chips 400 and 700 do not overlap each other. In this case, the first region RG1 may surround only a portion of the second region RG2. For example, as shown in FIG. 10, the third semiconductor chip 700 may be disposed adjacent to a lateral surface in the first direction D1 of the second semiconductor chip 400. The first region RG1 may not be disposed in the first direction D1 from the second region RG2.

The second pads 623 may be disposed on the second region RG2, and the first pads 622 may be disposed on the first region RG1. The first pads 622 and the second pads 623 may be located at the same level. The first pads 622 may not be disposed beside in the first direction D1 of the second pads 623. Therefore, it may be possible to easily arrange the connection lines 626 connected to the second pads 623. For example, the connection lines 626 connected to the second pads 623 may extend in the first direction D1 from the second pads 623, and may be spaced apart from the connection lines 626 connected to the first pads 622. The connection line 626 connected to the first pad 622 and the connection line 626 connected to the second pad 623 may extend in different directions from each other. Therefore, although the second and third semiconductor chips 400 and 700 are respectively mounted on the bottom and top surfaces of the redistribution layer 600 so as to vertically overlap each other, the first pads 622 and the second pads 623 may be located at the same level, the connection lines 626 may not interrupt their paths, and the second and third semiconductor chips 400 and 700 may be redistributed by one substrate wiring layer.

According to some embodiments, when viewed in a plan view as shown in FIG. 11, the third semiconductor chip 700 may protrude in the first direction D1 from the second semiconductor chip 400. For example, the third semiconductor chip 700 may be disposed shifted in the first direction D1 from the second semiconductor chip 400 so as to be offset. In this case, the first region RG1 may surround a portion of the second region RG2. When viewed in a plan view, the second region RG2 may protrude in the first direction D1 from an inside of the first region RG1. In the embodiment of FIG. 11, it may be possible to increase an area where the second region RG2 is not surrounded by the first region RG1 and to easily arrange the connection lines 626 connected to the second pads 623.

According to some embodiments, when viewed in a plan view, the third semiconductor chip 700 may protrude in the first and second directions D1 and D2 from the second semiconductor chip 400. For example, the third semiconductor chip 700 may be disposed shifted in the first and second directions D1 and D2 from the second semiconductor chip 400 so as to be offset. In this case, the first region RG1 may surround a portion of the second region RG2. In the embodiment of FIG. 12, it may be possible to increase an area where the second region RG2 is not surrounded by the first region RG1 and to easily arrange the connection lines 626 connected to the second pads 623.

Figure 13:
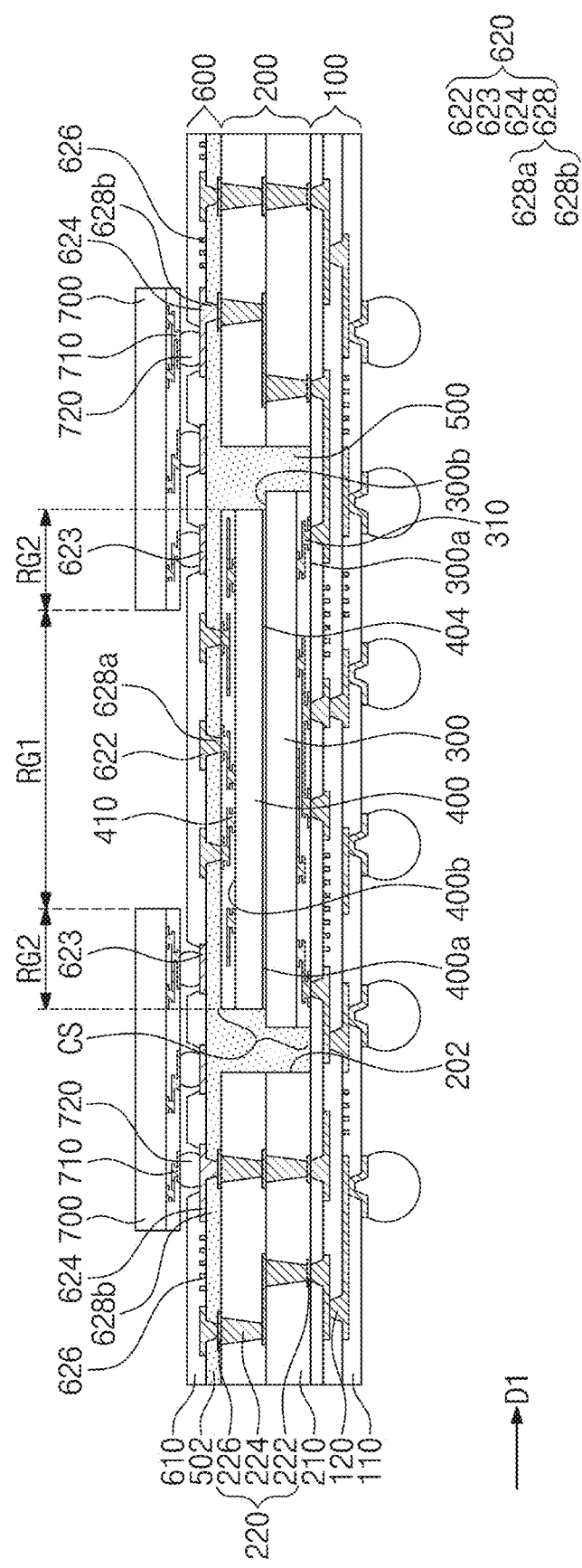
FIGS. 13 to 15 illustrate cross-sectional views showing a semiconductor package according to some embodiments of the present inventive concepts.

FIG. 13 illustrates a cross-sectional view showing a semiconductor package according to some embodiments of the present inventive concepts.

Referring to FIG. 13, the third semiconductor chip 700 may be provided in plural. The third semiconductor chips 700 may be disposed spaced apart from each other on the redistribution layer 600. A portion of each of the third semiconductor chips 700 may vertically overlap the second semiconductor chip 400. For example, the second region RG2 may be provided in plural, and the plurality of second regions RG2 may each be a region where the third semiconductor chip 700 overlaps the second semiconductor chip 400. The first region RG1 may be a zone where the second semiconductor 400 overlaps none of the third semiconductor chips 700, and may be positioned between the second regions RG2.

The first pads 622 may be disposed on the first region RG1, and the second pads 623 may be disposed on the second regions RG2.

Therefore, although the second and third semiconductor chips 400 and 700 are respectively mounted on the bottom and top surfaces of the redistribution layer 600 so as to vertically overlap each other, the first pads 622 and the second pads 623 may be located at the same level, the connection lines 626 may not interrupt their paths, and the second and third semiconductor chips 400 and 700 may be redistributed by one substrate wiring layer.

Figure 14:
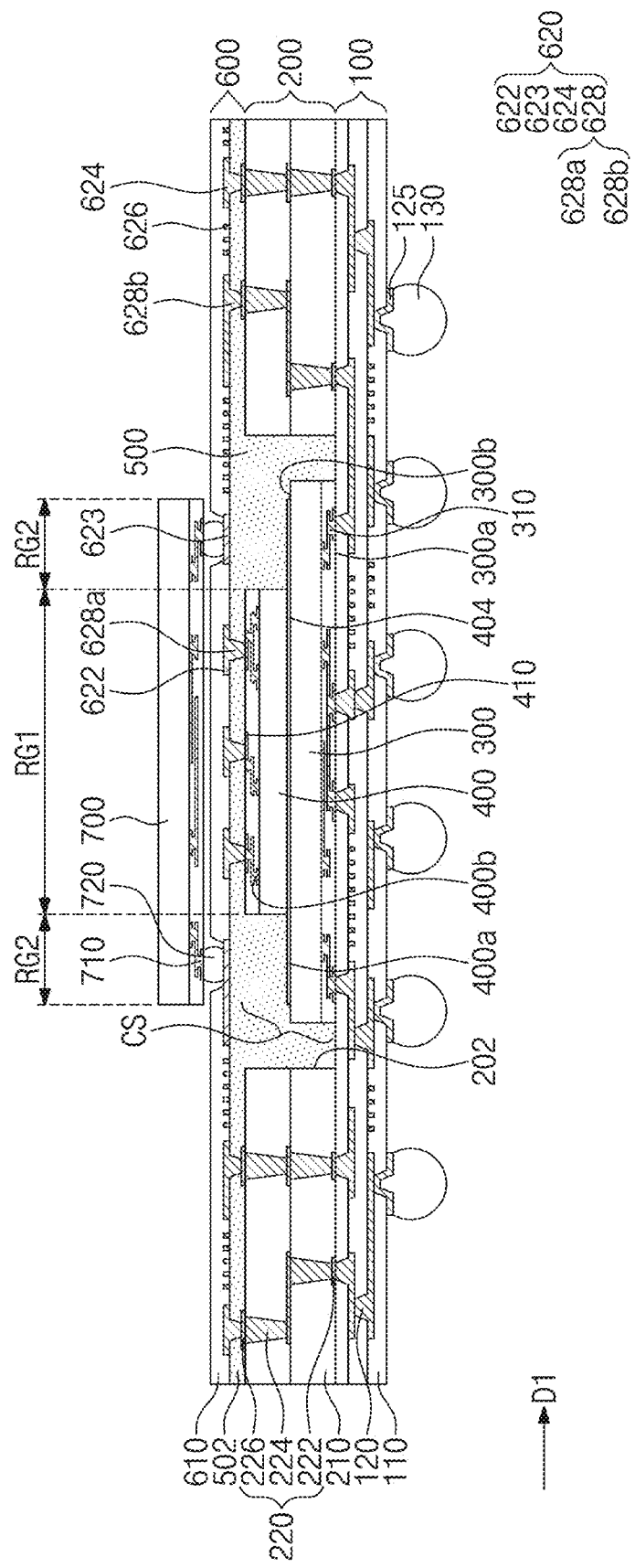

FIG. 14 illustrates a cross-sectional view showing a semiconductor package according to some embodiments of the present inventive concepts.

Referring to FIG. 14, the third width w3 of the third semiconductor chip 700 may be greater than the second width w2 of the second semiconductor chip 400. The third semiconductor chip 700 may vertically overlap the second semiconductor chip 400. The third semiconductor chip 700 may have a planar shape larger than that of the second semiconductor chip 400, and when viewed in a plan view, the second semiconductor chip 400 may be positioned inside the third semiconductor chip 700. Alternatively, when viewed in a plan view, the second semiconductor chip 400 may protrude from one or opposite sides of the third semiconductor chip 700. For example, the second semiconductor chip 400 may extend to run in one direction across the third semiconductor chip 700.

The redistribution layer 600 may have a first region RG1 on which the first pads 622 are provided and a second region RG2 on which the second pads 623 are provided. The second region RG2 may surround the first region RG1. The first region RG1 may be disposed above on the second semiconductor chip 400. For example, the first region RG1 may include a zone where the second semiconductor chip 400 overlaps the third semiconductor chip 700. The second region RG2 may include a zone where the second semiconductor chip 400 does not overlap the third semiconductor chip 700. For example, when viewed in a plan view, the second region RG2 may be disposed beside of the second semiconductor chip 400. The second pads 623 may be disposed to surround all of the first pads 622.

According to some embodiments of the present inventive concepts, the second semiconductor chip 400 with a small size may be mounted on the first pads 622 positioned on the first region RG1 or an inner region. In addition, the second pads 623 may be disposed outside the first region RG1, and the third semiconductor chip 700 with a large size may be mounted on the second pads 623. As discussed above, the first pads 622 and the third pads 633, on which the second semiconductor chip 400 and the third semiconductor chip 700 are respectively mounted, may be disposed on different regions that are spaced apart from each other. Therefore, even though the second and third semiconductor chips 400 and 700 are respectively mounted on the top and bottom surfaces of the redistribution layer 600 so as to vertically overlap each other, the first pads 622 and the second pads 623 may be located at the same level, and the second semiconductor chip 400 and the third semiconductor chip 700 may be redistributed by using one substrate wiring layer. For example, there may be a reduction in the number of substrate wiring layers that are required for the redistribution layer 600, and a semiconductor package may be provided to have a small thickness and a compact size.

Figure 15:
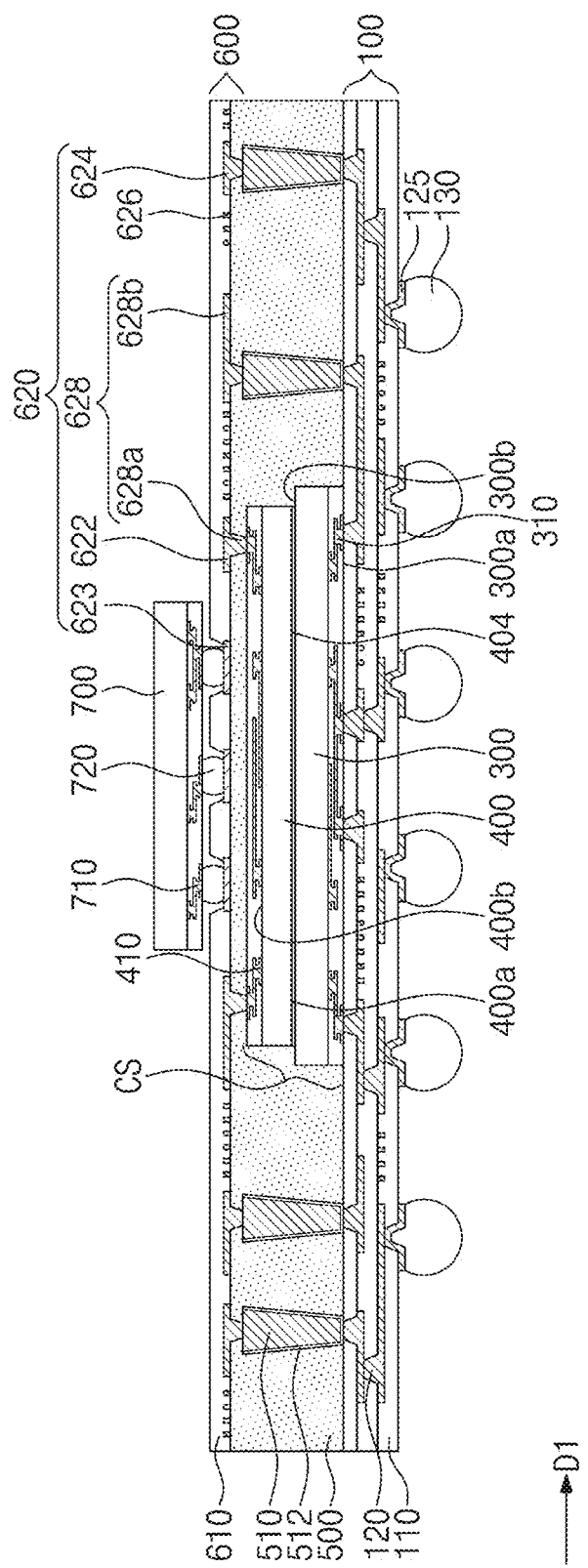

FIG. 15 illustrates a cross-sectional view showing a semiconductor package according to some embodiments of the present inventive concepts.

In FIGS. 1 to 14, there is provided the connection substrate 200 as a connection member that connects the package substrate 100 to the redistribution layer 600, but the present inventive concepts are not limited thereto. Compared to the semiconductor packages of FIGS. 1 to 14, a semiconductor package may not include the connection substrate 200. A through electrode 510 may be provided as a connection member that connects the package substrate 100 to the redistribution layer 600.

Referring to FIG. 15, the dielectric layer 500 may fill a space between the package substrate 100 and the redistribution layer 600. On the package substrate 100, the dielectric layer 500 may encapsulate the chip stack CS. For example, the dielectric layer 500 may surround the first semiconductor chip 300 and the second semiconductor chip 400, while covering the top surface of the second semiconductor chip 400.

A semiconductor package may further include a through electrode 510. The through electrode 510 may be disposed laterally spaced apart from the chip stack CS. The through electrode 510 may be disposed between the chip stack CS and an outer surface of the dielectric layer 500. The through electrode 510 may vertically penetrate the dielectric layer 500. The through electrode 510 may be coupled to the tail part of the uppermost first conductive pattern 120 in the package substrate 100. The through electrode 510 may be electrically connected to through the package substrate 100 to the external terminals 130 and the first semiconductor chip 300. The through via 510 may be coupled to the second redistribution via 628b of the redistribution layer 600. The through electrode 510 may include a metal pillar. The through electrode 510 may have a width that increases in a direction from the package substrate 100 toward the redistribution layer 600.

A seed/barrier layer 512 may be provided between the through electrode 510 and the dielectric layer 500. For example, the seed/barrier layer 512 may cover a bottom surface or lateral surfaces of the through electrode 510.

FIGS. 16 to 22 illustrate cross-sectional views showing a method of fabricating a semiconductor package according to some embodiments of the present inventive concepts.

Referring to FIG. 16, a connection substrate 200 may be provided. The connection substrate 200 may include a base layer 210 and a conductive part 220 in the base layer 210. For example, a printed circuit board (PCB) may be used as the connection substrate 200. The conductive part 220 may include lower pads 222, vias 224, and upper pads 226.

An opening 202 may be formed in the connection substrate 200. The connection substrate 200 may be partially removed to form the opening 202 penetrates therethrough. For example, the opening 202 may be formed by performing an etching process, such as a drilling process, a laser ablation process, or a laser cutting process. The opening 202 formed by removing a portion of the connection substrate 200 may be a space where a chip stack CS is provided in a subsequent process. The opening 202 may have an open hole that connects top and bottom surfaces of the connection substrate 200.

Referring to FIG. 17, the connection substrate 200 may be provided on the carrier substrate 800. The connection substrate 200 may be attached to the carrier substrate 800. For example, the carrier substrate 800 may include a glue tape. Alternatively, differently from that shown, an adhesive member (not shown) may further be provided between the carrier substrate 800 and the connection substrate 200.

A first semiconductor chip 300 may be provided on the carrier substrate 800. The first semiconductor chip 300 may be provided in the opening 202 of the connection substrate 200. The first semiconductor chip 300 may be disposed in a face-down state to allow first chip pads 310 on its lower portion to face the carrier substrate 800. The first chip pads 310 may be disposed on an active surface of the first semiconductor chip 300, and the active surface of the first semiconductor chip 300 may be attached to the carrier substrate 800.

A second semiconductor chip 400 may be provided on the first semiconductor chip 300. The second semiconductor chip 400 may be provided in the opening 202 of the connection substrate 200. The second semiconductor chip 400 may be disposed in a face-up state to allow second chip pads 410 on its upper portion to stand opposite to the carrier substrate 800. An inactive surface of the second semiconductor chip 400 may be attached to a top surface of the first semiconductor chip 300. For example, an adhesion layer 404 may be provided on the inactive surface of the second semiconductor chip 400, and then the second semiconductor chip 400 may be attached through the adhesion layer 404 to the first semiconductor chip 300. The first semiconductor chip 300 and the second semiconductor chip 400 may constitute a chip stack CS.

FIG. 17 depicts that the chip stack CS is formed by sequentially providing the first semiconductor chip 300 and the second semiconductor chip 400 in the opening 202, but the present inventive concepts are not limited thereto. For example, as shown in FIG. 18, a plurality of first semiconductor chips 300 may be formed on an entire surface of a first wafer WF1, and a plurality of second semiconductor chips 400 may be formed on an entire surface of the second wafer WF2. Afterwards, an oxidation process may be performed on a rear surface of the first wafer WF1 and a rear surface of the second wafer WF2, and then the rear surfaces of the first and second wafers WF1 and WF2 may be allowed to contact each other. The first wafer WF1 and the second wafer WF2 may be bonded to each other. For example, the first wafer WF1 and the second wafer WF2 may be bonded to each other through a hybrid bonding process due to surface activation at an interface between the first wafer WF1 and the second wafer WF2 that are in contact with each other. For another example, an adhesion layer may be used to bond the first wafer WF1 and the second wafer WF2 to each other.

A sawing process may be performed along a sawing line SL to separate the chip stack CS from each other. After that, the chip stack CS may be provided on the carrier substrate 800. The chip stack CS may be provided in the opening 202 of the connection substrate 200. The chip stack CS may be disposed to allow the first semiconductor chip 300 on its lower portion to face the carrier substrate 800. In this case, there may be fabricated a semiconductor package in accordance with the embodiment of FIG. 2. The following description will focus on the embodiment of FIG. 17.

Referring to FIG. 19, a dielectric layer 500 may be formed on the carrier substrate 800. For example, a molding member (not shown) may be coated on the connection substrate 200 and the chip stack CS, and then the molding member may be cured to form the dielectric layer 500. The dielectric layer 500 may cover the top surface of the connection substrate 200 and a top surface of the chip stack CS. The molding member may be introduced into a gap between the connection substrate 200 and the chip stack CS, and the dielectric layer 500 may fill the gap between the connection substrate 200 and the chip stack CS. The molding member may include an Ajinomoto build-up film (ABF). Alternatively, the molding member may include a dielectric polymer such as an epoxy-based polymer or a polymeric material such as a thermosetting resin.

Thereafter, as illustrated by a dotted line in FIG. 19, the carrier substrate 800 may be removed to expose the bottom surface of the connection substrate 200 and a bottom surface of the first semiconductor chip 300. When an adhesive member (not shown) is present on the carrier substrate 800, the adhesive member may also be removed together with the carrier substrate 800.

Figure 20:
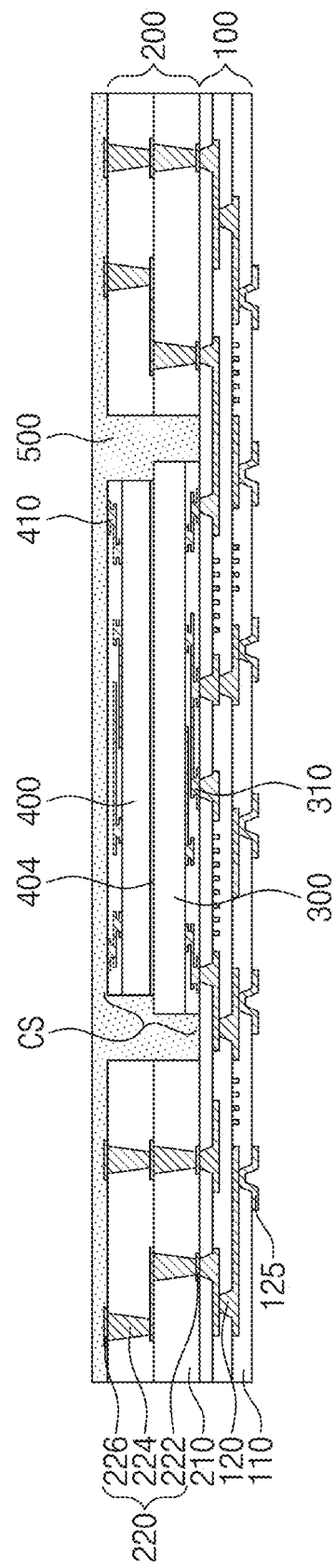

Referring to FIG. 20, a package substrate 100 may be formed below the connection substrate 200 and the first semiconductor chip 300. For example, a first dielectric pattern 110 and a first conductive pattern 120 may be formed on the bottom surface of the connection substrate 200 and the bottom surface of the first semiconductor chip 300, with the result that the package substrate 100 may be manufactured. For more detail, a dielectric layer may be formed on the bottom surface of the connection substrate 200 and the bottom surface of the first semiconductor chip 300, the dielectric layer may be patterned to expose the lower pads 222 of the connection substrate 200 and the first chip pads 310 of the first semiconductor chip 300, a conductive layer may be formed below the dielectric layer, and then the conductive layer may be patterned to form the first conductive pattern 120. Therefore, one substrate wiring layer may be formed, and the process mentioned above may be repeatedly performed to form the package substrate 100 that includes a plurality of substrate wiring layers. The first conductive pattern 120 may be coupled to the lower pads 222 of the connection substrate 200 and to the first chip pads 310 of the first semiconductor chip 300.

Substrate pads 125 may be formed below the package substrate 100. The substrate pads 125 may penetrate the first dielectric pattern 110 at bottom position and may be coupled to the first conductive patterns 120.

Figure 21:
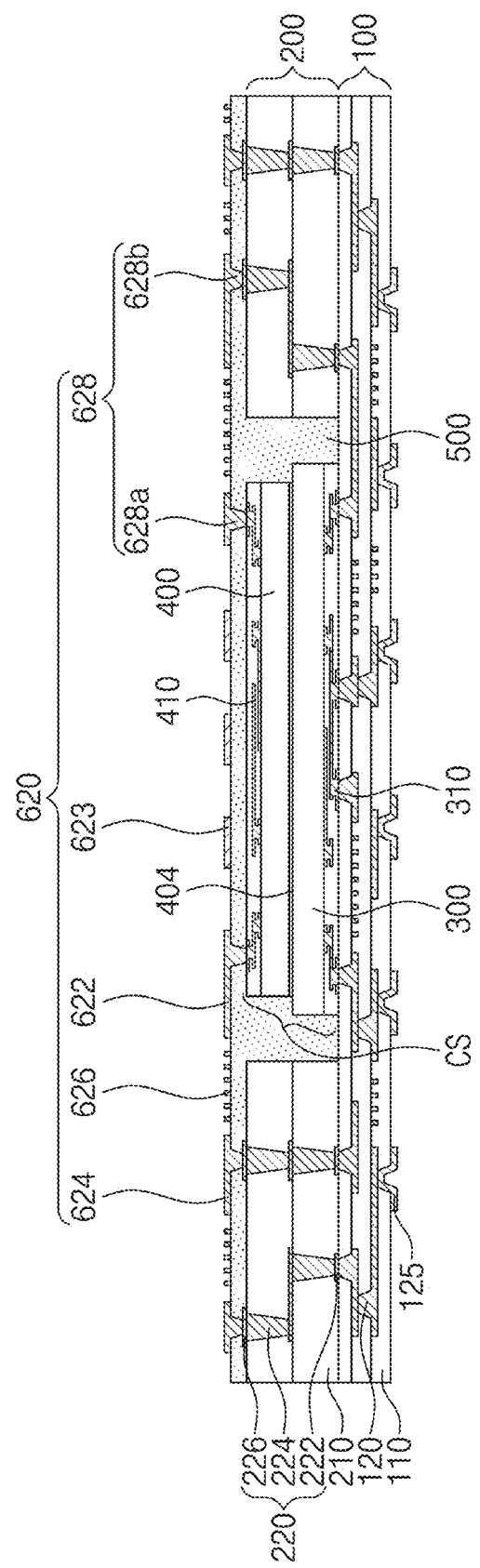

Referring to FIG. 21, a second conductive pattern 620 may be formed on the dielectric layer 500. For example, the dielectric layer 500 may be patterned to form first holes that expose the upper pads 226 of the connection substrate 200 and second holes that expose the second chip pads 410 of the second semiconductor chip 400, a conductive layer may be formed on the dielectric layer 500, and the conductive layer may be patterned to form the second conductive pattern 620. The second conductive pattern 620 may include first pads 622, second pads 623, third pads 624, connection lines 626, and redistribution vias 628. The first pads 622 may be pads to which the second semiconductor chip 400 is connected. The second pads 623 may be pads to which is connected a third semiconductor chip 700 which will be discussed below. The third pads 624 may be pads for connecting the second conductive pattern 620 to the connection substrate 200. In the first holes, second redistribution vias 628b may be formed connected to the upper pads 226 of the connection substrate 200, and in the second holes, first redistribution vias 628a may be formed connected to the second chip pads 410 of the second semiconductor chip 400.

Figure 22:
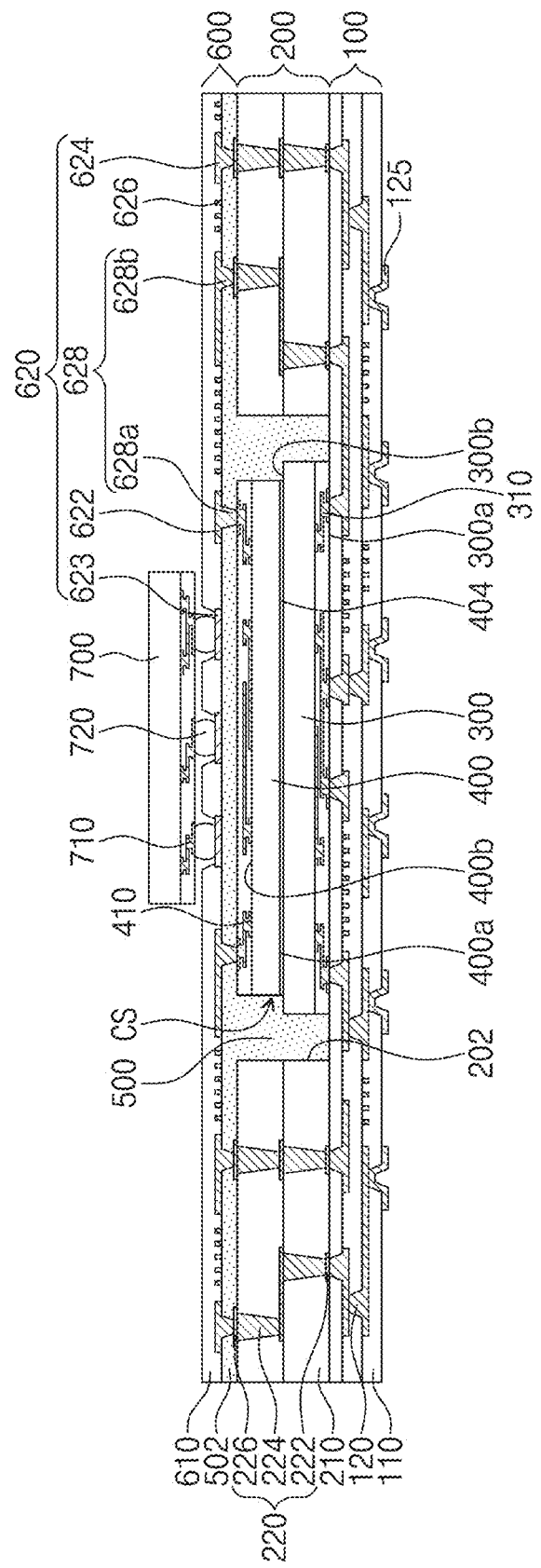

Referring to FIG. 22, a second dielectric pattern 610 may be formed by coating on the dielectric layer 500 a dielectric material to cover the second conductive pattern 620. The dielectric material may include a dielectric polymer or a photo-imageable dielectric (PID). For example, the photo-imageable dielectric may include at least one selected from photosensitive polyimide, polybenzoxazole (PBO), phenolic polymers, and benzocyclobutene polymers. The second dielectric pattern 610 and the second conductive pattern 620 may constitute a redistribution layer 600.

The second dielectric pattern 610 may be patterned to form recessions that expose the second pads 623.

A third semiconductor chip 700 may be mounted on the redistribution layer 600. For example, chip terminals 720 may be provided on third chip pads 710 of the third semiconductor chip 700, the third semiconductor chip 700 may be positioned to allow the chip terminals 720 to rest on the second pads 623, and then the chip terminals 720 may undergo a reflow process to mount the third semiconductor chip 700 on the redistribution layer 600.

Referring back to FIG. 1, external terminals 130 may be formed on a bottom surface of the package substrate 100, thereby being coupled to the substrate pads 125. The external terminals 130 may be electrically connected through the package substrate 100 to the connection substrate 200 and the first semiconductor chip 300.

For semiconductor package according to some embodiments of the present inventive concepts, semiconductor chips may all be disposed to vertically overlap each other, and thus may have their small occupied areas. In addition, pads of the semiconductor chips mounted on a redistribution layer may be formed on one substrate wiring layer, and the redistribution layer may use the one substrate wiring layer to redistribute the semiconductor chips, which may result in a reduction in thickness of redistribution lines. Accordingly, a compact-sized semiconductor package may be provided.

Moreover, the redistribution may have only one substrate wiring layer, and thus there may be a small length of electrical connection in the redistribution layer. As a result, a semiconductor package may have improved electrical properties.

Although the present inventive concepts have been described in connection with some embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A semiconductor package, comprising:
a package substrate;
a connection substrate on the package substrate and an opening that penetrates the connection substrate;
a chip stack on the package substrate and in the opening of the connection substrate;
a redistribution layer on the connection substrate and the chip stack;
an upper semiconductor chip on first redistribution pads of the redistribution layer; and
a plurality of external terminals on a bottom surface of the package substrate,
wherein the chip stack includes
a first semiconductor chip on substrate pads of the package substrate; and
a second semiconductor chip on the first semiconductor chip and on second redistribution pads of the redistribution layer,
wherein the redistribution layer includes
a first region that overlaps the upper semiconductor chip; and
a second region beside of the upper semiconductor chip,
wherein the first redistribution pads are on the first region, and
wherein the second redistribution pads are on the second region and entirely outside of the first region.

2. The semiconductor package of claim 1, wherein
the upper semiconductor chip has a width less than a width of the second semiconductor chip,
the upper semiconductor chip is within a perimeter of the second semiconductor chip, and
the second region surrounds the first region.

3. The semiconductor package of claim 1, wherein
the upper semiconductor chip runs across the second semiconductor chip in a first direction parallel to a top surface of the redistribution layer, and
the second region is on at least one side of the first region in a second direction that intersects the first direction.

4. The semiconductor package of claim 1, wherein
the upper semiconductor chip is offset from the second semiconductor chip in a first direction parallel to a top surface of the redistribution layer, and
the first region is in the first direction from the second region.

5. The semiconductor package of claim 1, wherein
at least one of the first redistribution pads overlap the second semiconductor chip, and
the second redistribution pads do not overlap the upper semiconductor chip.

6. The semiconductor package of claim 1, wherein
the upper semiconductor chip includes a first active surface that faces the redistribution layer, and first chip terminals of the upper semiconductor chip are connected to the first redistribution pads between the upper semiconductor chip and the redistribution layer, and
the second semiconductor chip includes a second active surface that faces the redistribution layer, and second chip terminals of the second semiconductor chip are connected to the second redistribution pads between the second semiconductor chip and the redistribution layer.

7. The semiconductor package of claim 1, wherein the redistribution layer includes:
a dielectric pattern;
the first redistribution pads and the second redistribution pads on a top surface of the dielectric pattern; and
a protection layer on the top surface of the dielectric pattern, the protection layer that covers the first redistribution pads and the second redistribution pads.

8. The semiconductor package of claim 1, wherein the redistribution layer includes:
a dielectric pattern;
the first redistribution pads and the second redistribution pads that are on a top surface of the dielectric pattern;
a protection layer on a top surface of the dielectric pattern and that covers the first redistribution pads and the second redistribution pads; and
a third redistribution pad on the protection layer and connected through a vertical connection via to the first redistribution pad,
wherein upper chip terminal of the upper semiconductor chip is directly connected to the third redistribution pad, and
wherein a second chip terminal of the second semiconductor chip penetrates the dielectric pattern to be directly connected to the second redistribution pad.

9. The semiconductor package of claim 1, wherein
the upper semiconductor chip is provided in plural, and
the second region of the redistribution layer is between the plurality of upper semiconductor chips.

10. A semiconductor package, comprising:
a package substrate;
a first semiconductor chip on the package substrate;
a redistribution layer on the first semiconductor chip;
a second semiconductor chip mounted on a first surface of the redistribution layer;
a third semiconductor chip mounted on a second surface of the redistribution layer; and
a connection member between the package substrate and the redistribution layer and beside of the first semiconductor chip, the connection member connects the package substrate to the redistribution layer, wherein the redistribution layer includes a first redistribution pad and a second redistribution pad that are at a same level from the package substrate, wherein the second semiconductor chip is directly connected through a first terminal on the first redistribution pad, wherein the third semiconductor chip is directly connected through a second terminal on the second redistribution pad, wherein the redistribution layer includes a first region on which the first redistribution pad is provided and a second region on which the second redistribution pad is provided, wherein the second redistribution pad vertically overlaps both of the second semiconductor chip and the third semiconductor chip, and wherein the first region vertically overlaps the second semiconductor chip and is laterally spaced apart from the third semiconductor chip.

11. The semiconductor package of claim 10, wherein the first surface of the redistribution layer is directed toward the package substrate, and an inactive surface of the second semiconductor chip is in contact with an inactive surface of the first semiconductor chip.

12. The semiconductor package of claim 10, wherein the third semiconductor chip has a width less than a width of the second semiconductor chip, and the third semiconductor chip is within a perimeter of the second semiconductor chip, and the first region surrounds the second region.

13. The semiconductor package of claim 10, wherein the redistribution layer includes:

a dielectric pattern;

the first redistribution pad and the second redistribution pad that are on a top surface of the dielectric pattern; and a protection layer on the top surface of the dielectric pattern, the protection layer covers the first redistribution pad and the second redistribution pad.

14. The semiconductor package of claim 10, further comprising a dielectric layer that fills a space between the package substrate and the redistribution layer, wherein the connection member includes a through electrode that vertically penetrates the dielectric layer.

15. The semiconductor package of claim 10, further comprising:

a connection substrate between the package substrate and the redistribution layer and having an opening that penetrates the connection substrate, the first semiconductor chip and the second semiconductor chip being in the opening; and a dielectric layer that fills a space between the connection substrate and the first and second semiconductor chips in the opening, wherein the connection member includes a substrate wiring pattern in the connection substrate.

\* \* \* \* \*